United States Patent
Higashi et al.

(10) Patent No.: US 8,496,037 B2
(45) Date of Patent: Jul. 30, 2013

(54) ADHESIVE INJECTION DEVICE

(75) Inventors: Masahisa Higashi, Kyoto (JP); Hideki Okamoto, Kyoto (JP); Eisaku Nakao, Kyoto (JP); Kazuya Okamoto, Tokyo (JP)

(73) Assignee: Shimadzu Corporation, Kyoto (JP)

( * ) Notice: Subject to any disclaimer, the term of this patent is extended or adjusted under 35 U.S.C. 154(b) by 170 days.

(21) Appl. No.: 12/936,879

(22) PCT Filed: Apr. 7, 2009

(86) PCT No.: PCT/JP2009/057126
§ 371 (c)(1),
(2), (4) Date: Feb. 28, 2011

(87) PCT Pub. No.: WO2009/125763
PCT Pub. Date: Oct. 15, 2009

(65) Prior Publication Data
US 2011/0155327 A1    Jun. 30, 2011

(30) Foreign Application Priority Data
Apr. 8, 2008 (JP) .................... 2008-100819

(51) Int. Cl.
*B29C 65/54* (2006.01)
*B32B 37/00* (2006.01)
*B32B 38/12* (2006.01)
*B32B 43/00* (2006.01)

(52) U.S. Cl.
USPC ................... 156/382; 156/538; 156/578

(58) Field of Classification Search
USPC ............ 156/285, 286, 305, 307.5, 381, 382, 156/391, 538, 578
See application file for complete search history.

(56) References Cited

U.S. PATENT DOCUMENTS

| | | | |
|---|---|---|---|
| 4,952,115 A * | 8/1990 | Ohkase | 414/618 |
| 5,183,378 A * | 2/1993 | Asano et al. | 414/757 |
| 7,594,805 B2 | 9/2009 | Miyakawa et al. | 425/110 |
| 2006/0021706 A1 | 2/2006 | Miyakawa et al. | 156/382 |

FOREIGN PATENT DOCUMENTS

| | | |
|---|---|---|
| JP | 07-320996 | 12/1995 |
| JP | 11-261000 | 9/1999 |
| JP | 11-261001 | 9/1999 |
| JP | 2002093774 A * | 3/2002 |
| JP | 2002141320 A * | 5/2002 |
| JP | 2004-207416 | 7/2004 |
| JP | 2006-049411 | 2/2006 |
| JP | 2006-203084 | 8/2006 |
| JP | 2006-203085 | 8/2006 |

OTHER PUBLICATIONS

Machine English translation of JP11-261000, (Sep. 30, 2012).*

(Continued)

*Primary Examiner* — Sing P Chan
(74) *Attorney, Agent, or Firm* — Bingham McCutchen LLP

(57) ABSTRACT

Provided is an adhesive injection device for injecting an adhesive between the substrates of laminates which each comprise at least two substrates that face each other. The adhesive injection device is provided with: a cassette which holds multiple laminates aligned along the direction of lamination of the substrates; and an adhesive injector which injects adhesive into each inter-substrate space, as the laminates are being held in the cassette, so that the actions of injecting the adhesive into each inter-substrate space overlap chronologically. Holding multiple laminates in the cassette makes it possible to treat the multiple laminates as a unit. By injecting adhesive into each inter-substrate space, as the laminates are being held, so that the actions of injecting the adhesive into each inter-substrate space overlap chronologically, the injection of adhesive into multiple laminates is simplified, and the time required for injection can be reduced.

16 Claims, 18 Drawing Sheets

OTHER PUBLICATIONS

English Abstract of JP 2002-093774 (Sep. 30, 2012).*
English Abstract of JP 2002-141320 (Sep. 30, 2012).*
International Preliminary Report on Patentability for the counterpart International application No. PCT/JP2009/057126.
Japanese language office action dated Feb. 19, 2013 and its English language translation issued in corresponding Japanese application 2010507247.

* cited by examiner

COATING WITH SEALANT

SEALANT CURED

INJECTION OF ADHESIVE

WIPING AWAY ADHESIVE

CURING OF ADHESIVE

ADHESIVE INJECTION DEVICE

TECHNICAL FIELD

The present invention relates to the manufacturing of laminated semiconductor devices and in particular to an adhesive injection device that is used to produce 3-dimensional semiconductor devices or semiconductor integrated circuits by injecting between laminated wafers an adhesive consisting of an insulating resin.

BACKGROUND ART

In a known semiconductor device production method, a plurality of wafers with semiconductor devices or semiconductor integrated circuits formed thereon in advance are laminated together, and the laminated wafers are electrically connected by vertical wirings to form 3-dimensional laminated semiconductor circuit devices. With this way of producing 3-dimensional laminated semiconductor circuit devices, an upper layer wafer and a lower layer wafer with semiconductor devices or semiconductor integrated circuits formed thereon in advance are laminated, and an insulating resin is injected between the upper and lower layer wafer to produce 3-dimensional laminated semiconductor circuit devices.

For example, Patent Literature 1 discloses a method for producing semiconductor devices wherein a plurality of semiconductor chips that have been diced into chips are laminated within an enclosure. A resin is then introduced into the enclosure through a plurality of slits to form an insulating resin layer between the semiconductor chips.

Patent Literature 2 discloses a method related to the manufacture of laminated wafers wherein rectangular copper walls are formed on a wafer surface to serve as a seal when the wafers are joined together, and a vacuum differential pressure is used to inject resin.

FIG. 17 shows the steps involved in using a seal to inject an insulating adhesive into the inter-wafer space. With this injection process that uses an adhesive injection device 200, a copper wall 203 is formed to enclose copper bumps 201 that are formed on a wafer with an inlet opening 204 formed at a portion of the copper wall 203 (FIG. 17(a)). After a vacuum is created, the inlet opening 204 is immersed into an insulating adhesive 205 (FIG. 17(b)), $N_2$ gas is then introduced into the adhesive injection device to break the vacuum and create an atmospheric pressure (FIG. 17(c)), causing the insulating adhesive 215 to be injected into the inter-wafer spaces (FIG. 17(d)).

Patent Literature 2 discloses another method for injecting resin between laminated wafers but does not involve forming a seal on the laminated wafers. With this method, an adhesive is disposed around the entire periphery of a wafer, and the resin is injected using vacuum differential pressure.

In FIG. 18, vacuum chamber 215 of the adhesive injection device 210 includes vessel 211 made of an upper jig 212 and a lower jig 213, and an upper stage 213 and a lower stage 214 which fix the vessel 211. Laminated wafers 220 are placed inside the vessel 211. The vacuum chamber 215 is connected to a vacuum evacuation apparatus 216 which creates a vacuum inside the vacuum chamber, an inert gas introduction unit 217 which introduces an inert gas into the vacuum chamber and an adhesive supply unit 218 which supplies adhesive into the vessel 211.

By introducing an inert gas into the vessel 211, a pressure difference is created between the vessel and the laminated wafers. The pressure difference is used to inject an adhesive from the entire periphery of the laminated wafers.

PATENT LITERATURE

Patent Literature 1: Unexamined Patent Application Publication 2004-207416
Patent Literature 2: Unexamined Patent Application Publication 2006-49441
Patent Literature 3: Unexamined Patent Application Publication 11-261001

OVERVIEW OF THE INVENTION

Problems to be Solved by the Invention

With each of the afore-described previous methods, injecting an adhesive into the inter-substrate space between a plurality of laminated substrates such as laminated wafers, liquid crystal substrates and circuit substrates in laminates consisting of multiple laminated substrates requires repeating the adhesive injection process by as many times as the number of laminated substrates that constitute a single laminate. Performing this injection process for each laminate is a very time consuming process.

It is the object of the present invention to provide an adhesive injection device which solves the afore-described previous problems and simplifies the process for injecting an adhesive into multiple laminates.

Means for Solving the Problems

In an adhesive injection device for injecting an adhesive between the substrates of laminates which each includes at least two substrates that face each other, the present invention is an adhesive injection device including: a cassette which holds multiple laminates that are arranged in the direction of lamination of each of the substrates; and an adhesive injector which injects the adhesive into each of the inter-substrate space, as said laminates are being held in the cassette, so that the actions of injecting the adhesive into each of the inter-substrate space overlap in time.

Here, the substrate is a thin, planar member such as a wafer, liquid crystal substrate, circuit substrate and the like. A laminate is a structure where the substrates are disposed to face each other. Multiple laminates are formed by arranging a plurality of laminates in a laminating direction.

With the present invention, multiple laminates can be treated as a single unit. By injecting the adhesive into each inter-substrate space, as multiple laminates are being held, so that the actions of injecting the adhesive into each inter-substrate space overlap in time, the injection of an adhesive into multiple laminates is simplified, and the time required for the injection is reduced. Furthermore, by treating multiple laminates as a single unit, the alignment of the rotational position of each laminate is simplified.

The phrase "the actions of injecting the adhesive into each inter-substrate space overlap in time" does not mean that the injection of the adhesive into each inter-substrate space occurs strictly at the same time but that the injection of the adhesive into each of the inter-substrate spaces occurs within a common span of time and therefore allows some timing difference.

The present invention further includes a coating unit that applies a sealant to the outer peripheral end faces of multiple laminates. The coating unit includes a contact member which applies the sealant. The state where at least a part of each of the outer peripheral end faces is contacted by the contact member overlaps in time.

The coating member of the coating unit with sealant adhered thereon is made to contact the outer peripheral end faces of the multiple laminates, thereby applying the sealant. In the action by the contact member for applying the sealant to the outer peripheral end faces of multiple laminates, the phrase "the state where at least a part of each of the outer peripheral end faces is contacted by the contact member overlaps in time" does not mean that the contact between the sealant and the outer peripheral end faces of each laminate occurs strictly at the same time but that the sealant contacts the outer peripheral end faces of each of the laminates within a common span of time and therefore allows some timing difference.

The multiple laminates are held in a cassette to be rotatable about an axial line that extends in their arrangement direction so that their rotation about the axial line results in the outer peripheral end faces to be coated with a sealant by the coating unit.

The cassette includes two frame members that hold multiple laminates in between from both sides in the arrangement direction of the multiple and connecting members which connect the frame members and also support the multiple laminates.

The connecting members include a rotating roller that rotates about an axial line that extends in the arrangement direction of the multiple laminates. The laminates are rotated by the rotation of the rotating roller.

The connecting members which support the multiple laminates include a pressing roller and a driven roller. The driven roller is driven and rotated by the rotating roller. The pressing roller presses each of the laminates against the rotating roller and driven roller.

The pressing roller can move towards and also move away from the multiple laminates. By moving towards the multiple laminates, the pressing roller presses each of the laminates against the rotating roller and the driven roller. By moving away from the multiple laminates, the pressing roller releases the pressure that is exerted on the rotating roller and the driven roller.

A plurality of spacer members that are interposed between each of the multiple laminates is disposed on at least either the rotating roller, driven roller or the pressing roller. The plurality of spacer members forms an inter-laminate space of a predetermined size between the multiple laminates.

Each spacer member is thick enough so that when the outer peripheral end faces of the multiple laminates are coated with the sealant by the coating unit, the sealing between the laminates by the sealant is prevented. This prevents the sealant from penetrating into the space between adjacent laminates and connecting the inter-laminate spaces.

The multiple laminates have an uncoated region where a sealant is not applied. The adhesive injection device according to the present invention further includes an alignment mechanism which aligns each of the laminates at a predetermined rotational position.

The alignment mechanism aligns each of the laminates using as a reference a notch or an orientation flat that is formed on the substrates. The alignment mechanism positions the uncoated region of each of the laminates at the same rotational position.

The adhesive injector includes a vessel that accepts multiple laminates. The adhesive injector injects the adhesive by holding the vessel so that there is an overlap in time when at least the uncoated region of the multiple laminates is in contact with the adhesive.

Injecting the adhesive so that there is an overlap in time when at least the uncoated region of the multiple laminates is in contact with the adhesive does not mean that the contact between the adhesive and the uncoated regions occurs strictly at the same time but that the contact occurs within a common span of time and therefore allows some timing difference.

The adhesive injector uses the vacuum differential pressure method to inject an adhesive through the uncoated region into the inter-substrate space. When using the vacuum differential pressure method, by overlapping in time the state where at least the uncoated region of the multiple laminates is in contact with the adhesive, the time required for injecting the adhesive into the inter-substrate space of the multiple laminates is reduced.

The adhesive injection device according to the present invention further includes an adhesive wiping unit for removing excess adhesive that is present at the uncoated regions of the multiple laminates.

The adhesive injection device according to the present invention further includes a sealant curing unit for curing the sealant that is coated by the coating unit.

The adhesive injection device according to the present invention further includes an adhesive preparation chamber for preparing the adhesive that is used by the adhesive injector.

With the adhesive injection device according to the invention, the coating unit, sealant curing unit, adhesive injector and the adhesive preparation chamber are arranged in-line. This in-line arrangement allows the process of coating the outer peripheral ends of the multiple laminates with a sealant, the process of curing the coated sealant to form a seal and the process of injecting an adhesive into the inter-substrate space formed by the seal to be performed continuously, accompanying the movement of the laminates.

With the present invention, by holding multiple laminates in a cassette, not only can the multiple cassettes be treated as a single unit but the multiple laminates can be processed in the coating chamber, sealant curing chamber and the adhesive injection chamber with an overlap in time. Furthermore, the alignment of multiple laminates in each processing chamber can be performed with ease. By performing it within the processing chamber, contamination caused by ambient atmosphere is prevented. In particular, the alignment in the coating chamber of the injection openings is simplified.

With the present invention, the laminates can be rotated within the cassette, allowing the laminates to be aligned so that the phases of the injection openings disposed on the laminates match. This alignment can be performed with the cassette remaining in the processing chamber.

The present invention also includes an adhesive wiping chamber where excess adhesive that is present near the injection openings of the multiple laminates is removed. The adhesive wiping chamber is arranged in line with but on the downstream side of the adhesive injection chamber. By positioning the adhesive wiping chamber in line with but on the downstream side of the adhesive injection chamber, excess adhesive that is present near the injection openings from the adhesive injection process that is performed in the adhesive injection chamber is removed, thus reducing the contamination of the multiple laminates that are in the cassette.

Effects of the Invention

As afore-described, the adhesive injection device according to the present invention simplifies the process of injecting an adhesive into multiple laminates during the manufacture of semiconductor devices and semiconductor circuit devices.

EMBODIMENTS OF THE INVENTION

An embodiment of the present invention is described next in detail with reference to drawings. Here, wafers are used as substrates, and laminated wafers form the laminate. However, the substrate is not limited to wafers and may also be, for example, liquid crystal substrates or circuit substrates. Furthermore, the laminates are not limited to laminated wafers and may be, for example, a structure formed by the lamination of liquid crystal substrates or circuit substrates.

Figure 1:
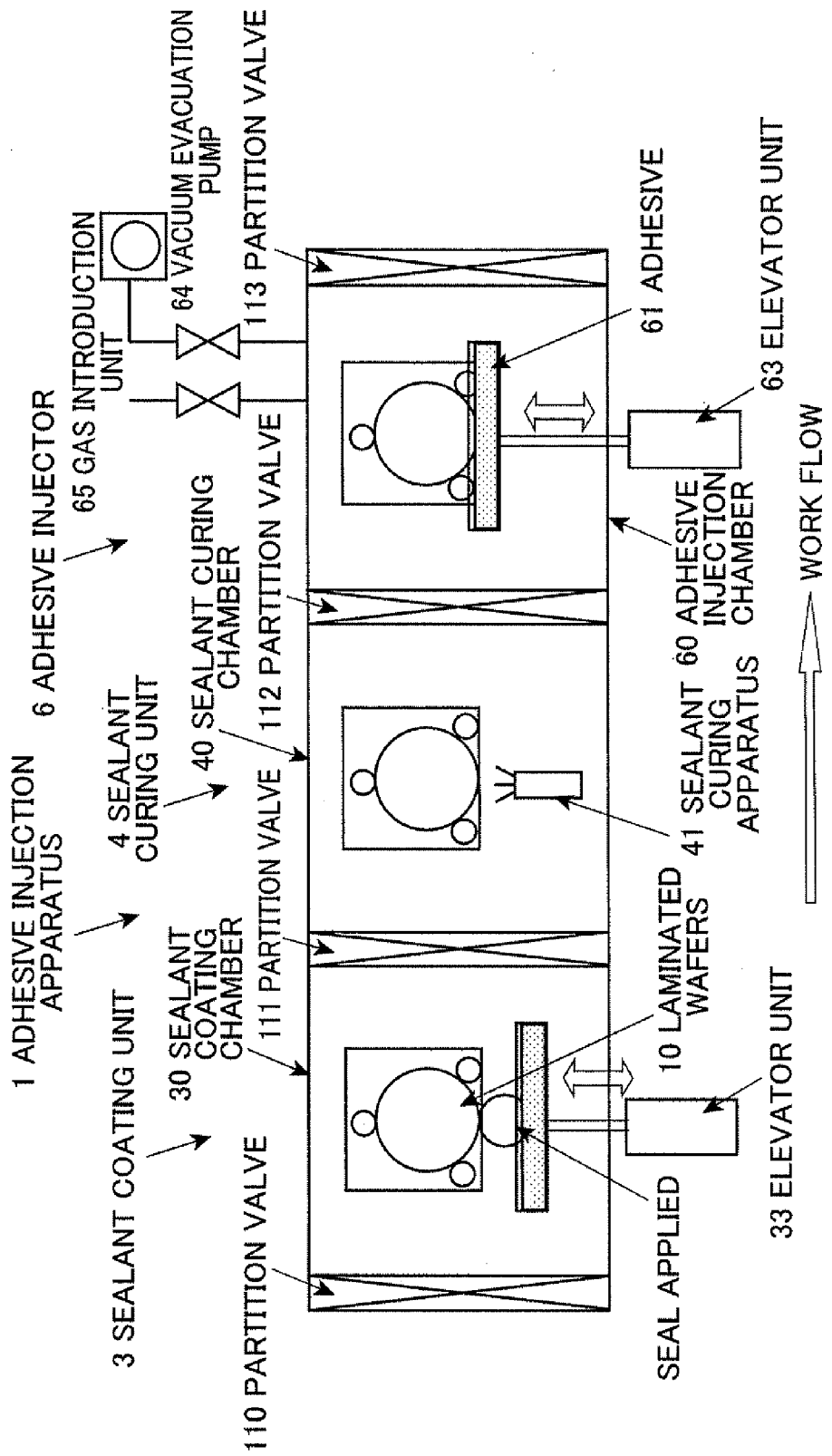
FIG. 1 is a schematic view showing the manufacture of a 3-dimensional laminated semiconductor device.

FIG. 1 is a schematic view that shows a device used for the manufacture of a 3-dimensional laminated semiconductor device. In FIG. 1, the laminated semiconductor device manufacturing device includes a portion of it that is used for performing a seal formation process wherein a seal is formed along the outer peripheral end faces of the laminated wafers and a portion of it for injecting an adhesive into the inter-wafer spaces between the laminated wafers where the seal is formed, thereby joining the laminated wafers.

FIG. 1 shows an example of an in-line arrangement of the seal formation step and the adhesion step. The seal formation step is performed by a sealant coating unit 3 and a sealant curing unit 4. The adhesion step is arranged on the downstream side of the sealant curing unit 4 and is performed by an adhesive injector 6.

The sealant coating unit 3 is equipped with a coating apparatus inside a sealant coating chamber 30. The sealant curing unit 4 is equipped with a curing apparatus inside a sealant curing chamber 40. The adhesive injector 6 is equipped with an adhesive injection device inside an adhesive injection chamber 60. Partition valves 111 and 112 are disposed between the respective chambers consisting of the sealant coating chamber 30, sealant curing chamber 40 and adhesive injection chamber 60. Partition valves 110 and 113 are respectively disposed between the sealant coating chamber 30 and external atmosphere and between the adhesive injection chamber 60 and external atmosphere.

Laminated wafers are introduced into the sealant coating unit 3 through the partition valve 110. Resin serving as a sealant is applied to the outer peripheral end face of the introduced laminated wafers 10 to form a seal.

Laminated wafers 10 with a seal formed thereon are introduced into the sealant curing unit 4 through partition valve 111. The resin serving as the sealant on the introduced laminated wafers 10 is cured by the sealant curing apparatus 41 which cures the sealant resin that was applied and forms a seal. This seal forms the boundary portion for forming a pressure difference by the differential pressure method in order to incorporate the insulating resin, a sealing material, between the adjacent wafers of laminated wafers.

After the seals on the laminated wafers 10 are cured by the sealant curing unit 4, the laminated wafers 10 are introduced through the partition valve 112 into the adhesive injection chamber 60 of the adhesive injector 6. An adhesive 61 is injected between the wafers of the introduced laminated wafers 10. The laminated wafers 10 with the injected adhesive 61 are passed through the partition valve 113 of the adhesive injection chamber 60 and are led out to the external atmosphere side. The adhesive injection chamber 60 is equipped with a vacuum evacuation pump 64 which evacuates the adhesive injection chamber 60 for creating a vacuum and a gas introduction unit 65 for introducing a gas such as $N_2$ gas for restoring the adhesive injection chamber 60 to atmosphere. The adhesive injector 6 uses the pressure difference between the vacuum state created by the evacuation by the vacuum evacuation pump 64 and the atmospheric pressure or higher created by the introduction of a gas by the gas introduction unit 65, that is, the vacuum differential pressure method, to introduce the adhesive into the inter-wafer space between the laminated wafers 10.

The sealant coating chamber 30 is equipped with an elevator unit 33 which raises and lowers a vessel holding an insulating resin that serves as the sealant. The adhesive injection chamber 60 is equipped with an elevator unit 63 which raises and lowers a vessel holding an insulating resin that serves as the adhesive.

With the present invention, in performing the different processes including the seal formation steps (sealant coating and sealant curing processes) and the adhesion steps (adhesive injection and adhesive curing processes), the laminated wafers 10 are held in a cassette and the processes are performed in terms of individual cassettes. This allows a plurality of laminated wafers to be processed together in a batch process.

FIG. 2 shows a cassette that is used with the present invention. The cassette shown in FIG. 2 is only one example of such a cassette, and the present invention is not limited to this particular structure.

In FIG. 2, the cassette 100 includes frame members 100a and 100b—which hold laminated wafers 10 in between in the axial direction—and connecting members 100c and 100d which connect the two frame members 100a and 1001). In addition to connecting the frame members 100a and 100b, connecting members 100c and 100d hold the laminated wafers 10 in the cassette 100 and also serve as rotating rollers that rotatably drive the laminated wafers 10.

FIG. 2 shows a structure that includes, as connecting members, driving roller 100c that transmits a rotational driving force to the laminated wafers 10, driven roller 100d which rotatably supports the laminated wafers 10 and is driven in rotation by driving roller 100c and pressing roller 100e which holds the laminated wafers 10 by pressing them against the driving roller 100c and the driven roller 100d.

The driving roller 100c is a rotating roller that rotates about an axial line extending in the arrangement direction of a plurality of laminated wafers 10. The laminated wafers 10 are rotated by rotating this rotating roller. Hereinafter, the term "driving roller" is used to refer to this rotating roller.

Figure 2A:
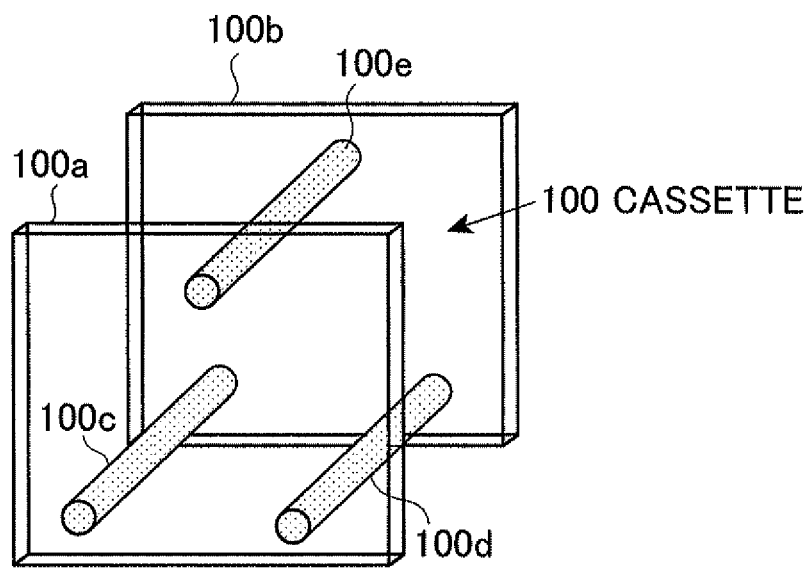
FIG. 2 shows a cassette according to the present invention.
Figure 2B:
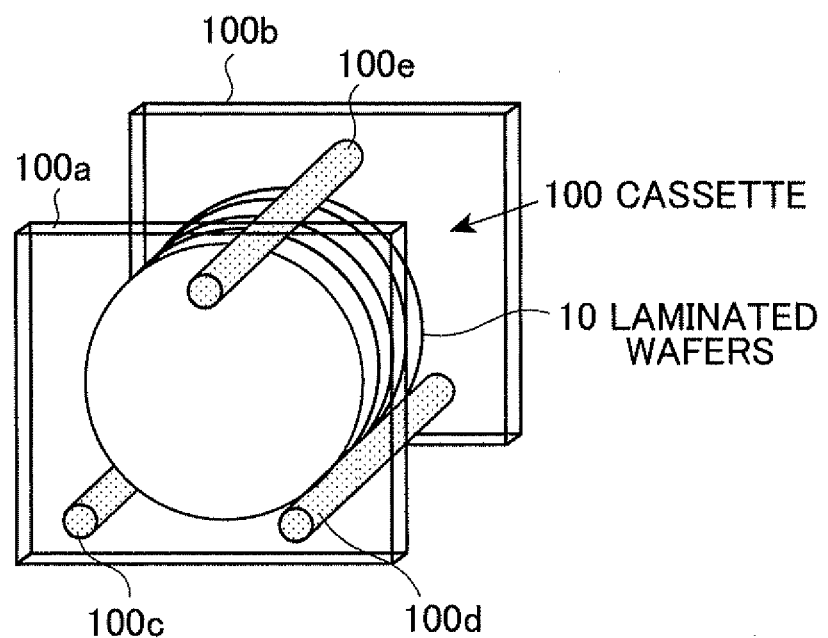

FIG. 2(a) shows the configuration of only the cassette 100 whereas FIG. 2(b) shows laminated wafers 10 held in the cassette 100. The driving roller 100c is driven by a driving mechanism (not illustrated) and drives the supported laminated wafers 10 in rotation. The driven roller 100d rotates as dictated by the rotation of the rotating laminated wafers 10. The driven roller 100d may be driven by connecting it to the driving roller 100c by means of a transmission mechanism (not illustrated) or may be driven in rotation by a driving mechanism (not illustrated).

The pressing roller 100e can move towards and also move away from the laminated wafers 10 that are placed. In FIG. 2, the pressing roller 100e contacts the laminated wafers 10 from above and presses them against the driving roller 100c and driven roller 100d and holds the laminated wafers 10 in the cassette 100. Even though the mechanism used for pressing the pressing roller 100e against the laminated wafers is not shown in FIG. 2, this can be accomplished using, for example, an urging spring.

Figure 3:
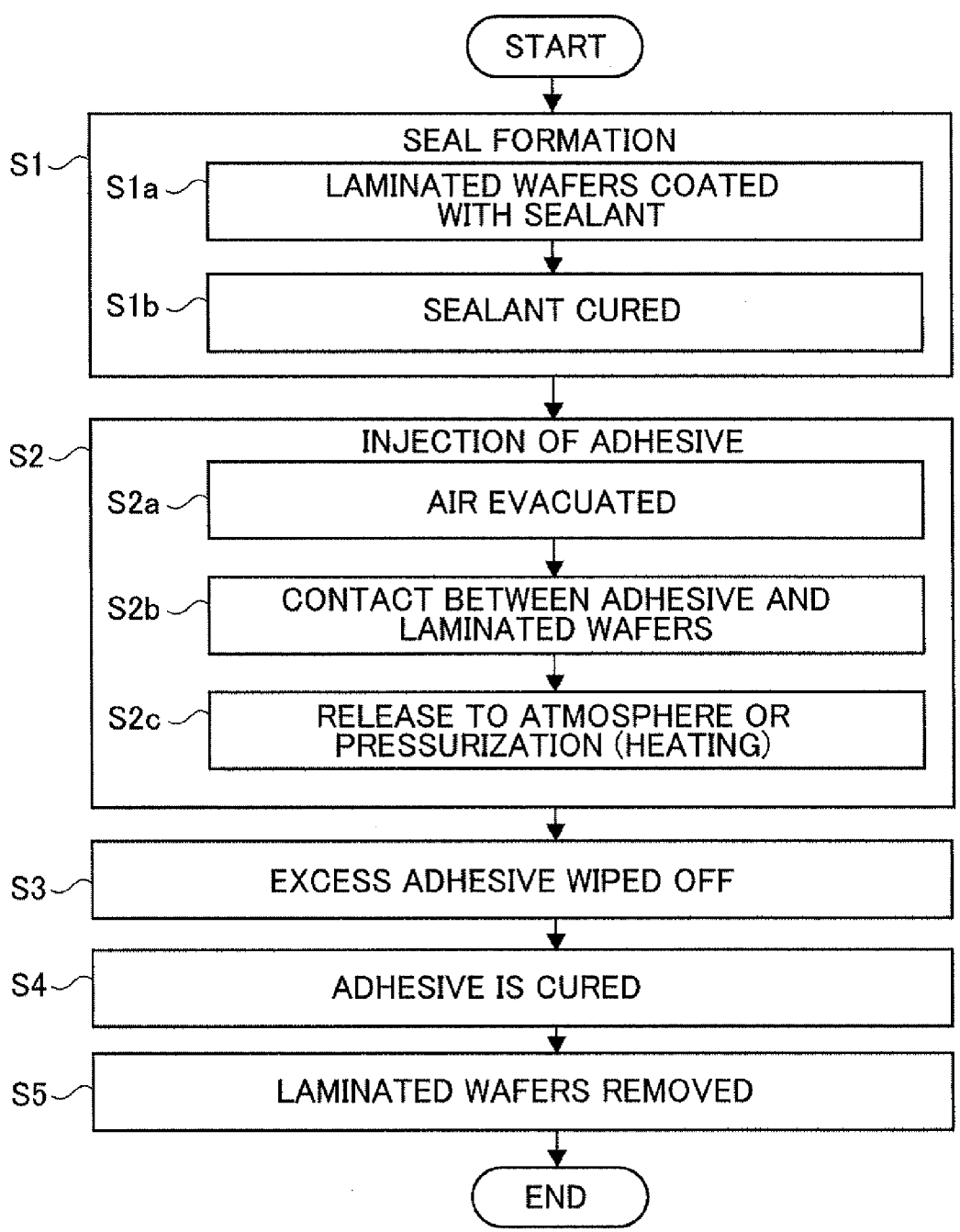
FIG. 3 is a flowchart describing the operation of an adhesive injection device according to the present invention.
Figure 4A:
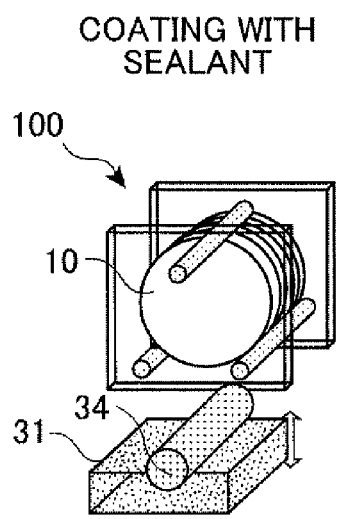
FIG. 4 shows different operational states in the operation of the adhesive injection device according to the present invention.
Figure 4B:
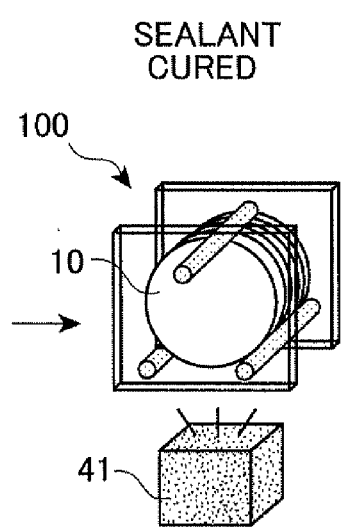
Figure 4C:
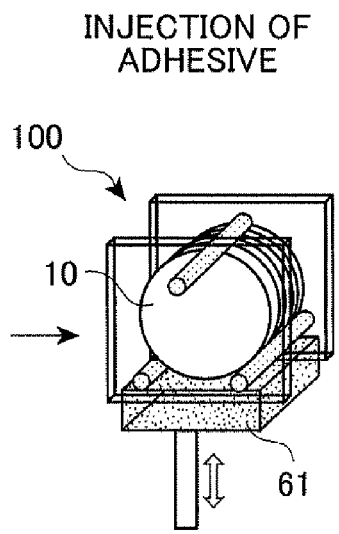
Figure 4D:
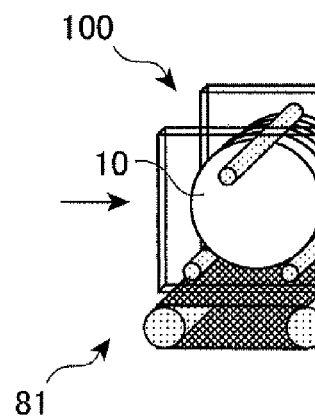
Figure 4E:
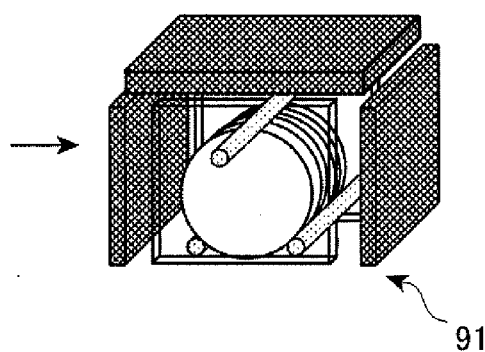

FIGS. 3 and 4 describe the operation of the adhesive injection device according to the present invention. FIG. 3 is a flowchart describing the operation, and FIG. 4 shows examples of the different operational states.

First, the injection opening is removed and a seal is formed at the outer peripheral end faces of the laminated wafers 10. This seal formation step includes steps for coating the outer peripheral end faces of the laminated wafers 10 with a resin serving as a sealant (FIG. 4(a) and S1a) and the steps for curing the applied sealant (FIG. 4(b) and S1b). The sealant resin is cured by the sealant curing apparatus 41. The sealant curing apparatus 41 uses ultraviolet light if the resin is a UV curing resin and uses heat if the resin is a thermosetting resin (S1).

Next, an adhesive consisting of an insulating resin is injected between the wafers of the laminated wafers 10. The injection of the adhesive is achieved by evacuating the vessel containing the laminated wafers 10 with a vacuum pump (S2a), bringing the adhesive into contact with the injection openings of the laminated wafers 10 (S2b) and then introducing $N_2$ gas and the like into the vessel to release the internal pressure to atmospheric pressure or higher so that the pressure difference between the inside and the outside of the laminated wafers 10 causes the adhesive to be injected into the laminated wafers 10. It is acceptable to facilitate the injection of the adhesive into the laminated wafers 10 by heating the adhesive to reduce its viscosity (S2c). In this way, adhesive 61 is injected between the wafers of the laminated wafers 10 (S2).

After the adhesive is injected between the wafers in the laminated wafers 10, any excess adhesive that is present near the injection openings is wiped off. The adhesive can be wiped off by bringing the wiping material of wiping apparatus 81 into contact with the injection openings of the laminated wafers 10 (FIG. 4(d) and S3). After excess adhesive is wiped away, the injected adhesive is cured to join the laminated wafers. The adhesive can be cured, for example, by heating (FIG. 4(e) and S4).

After the adhesive is cured, the laminated wafers 10 are removed from the adhesive injection device (S5).

With the present invention, each of the afore-described processes is performed on the laminated wafers 10 on a per cassette basis with multiple laminated wafers 10 held in the cassette 100.

The configuration of the sealant coating unit 3 of the seal formation apparatus is described next with reference to FIGS. 5 through 8. With this configuration, a coating roller impregnated with a sealant resin is brought into contact with the outer peripheral end faces of the laminated wafers, and the laminated wafers are made to axially rotate, thereby continuously applying a sealant to the outer peripheral end faces of the laminated wafers.

Figure 5:
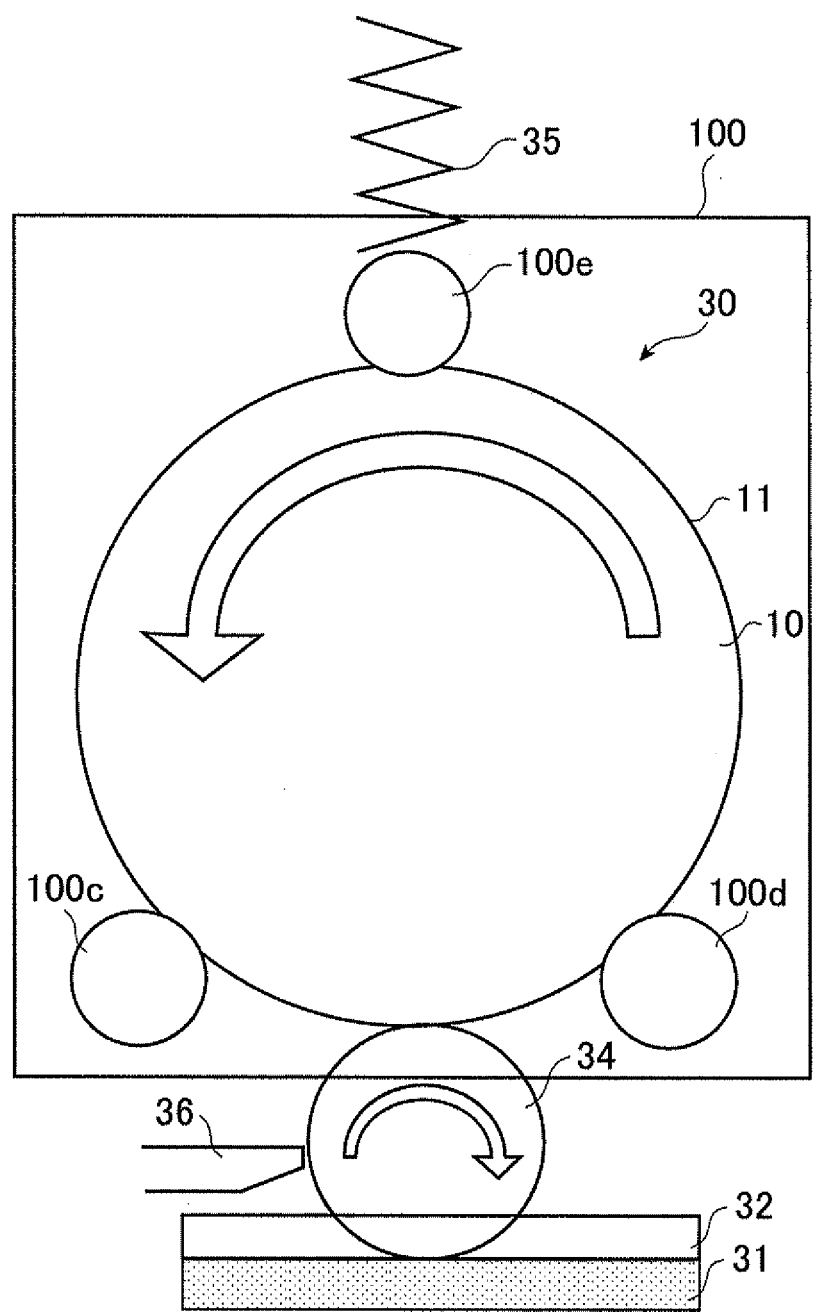
FIG. 5 is a schematic plan view showing the configuration of the sealant coating unit in the seal formation apparatus of the present invention.
Figure 6:
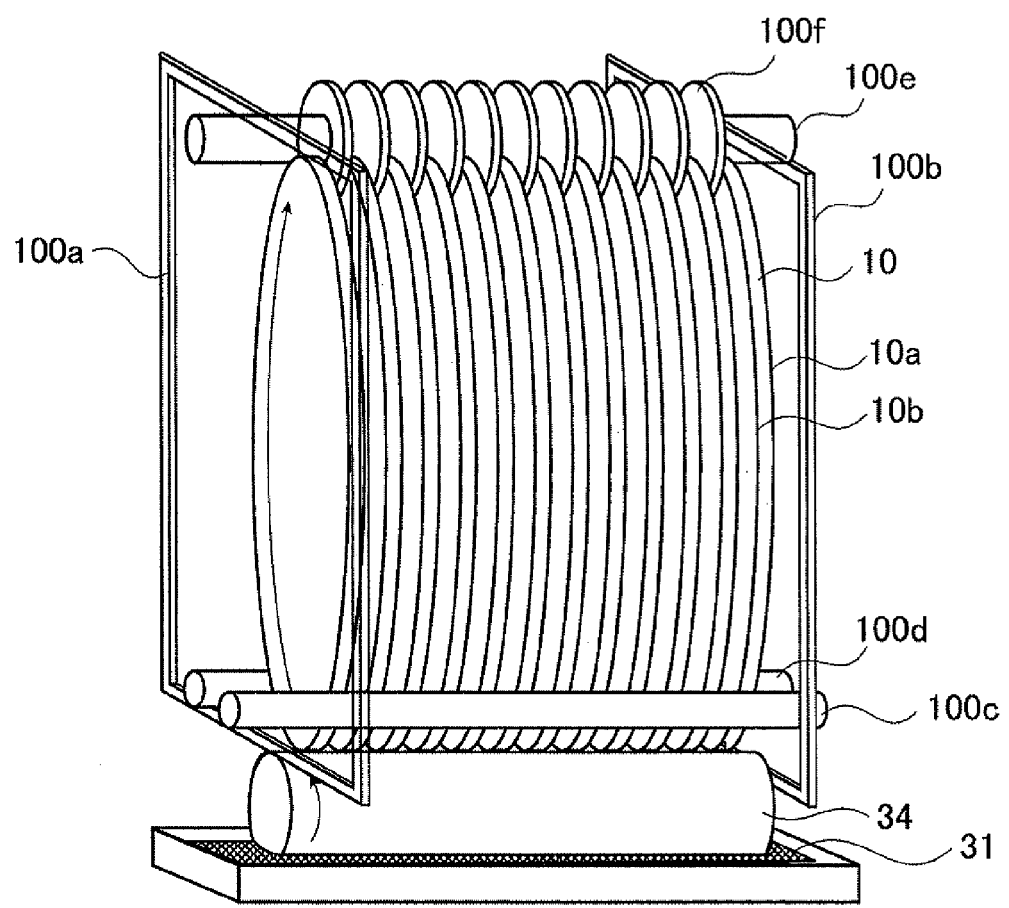
FIG. 6 is a schematic perspective view showing the configuration of the sealant coating unit in the seal formation apparatus of the present invention.

The configuration of the sealant coating unit 3 of the seal formation apparatus is described first. FIG. 5 shows a schematic plan view of the configuration. FIG. 6 shows a schematic perspective view of the configuration.

In FIG. 5 and FIG. 6, the laminated wafers 10 held in cassette 100 are introduced into the sealant coating unit 3 where a sealant resin is applied to the outer peripheral end faces of the laminated wafers 10. The laminated wafers 10 are placed on the driving roller 100e and driven roller 100d of cassette 100 and are held in place by the downward pressure exerted by pressing roller 100e. The pressing roller 100e presses downwardly on the laminated wafers 10 by the effect of, for example, an urging spring 35. It is acceptable for the driven roller 100d to be a driving roller. The laminated wafers 10 are axially rotated by the driving roller 100c which is driven by a driving mechanism not illustrated.

In FIG. 6, a plurality of spacer members 100f is disposed on the pressing roller 100e, each spacer member being positioned between the individual wafers of the laminated wafers 10. The plurality of spacer members 100f forms inter-wafer space of a predetermined size between the laminated wafers 10. The thickness dimension of each spacer member 100f is large enough so that when the outer peripheral end faces of the plurality of laminated wafers 10 are coated with the sealant by the sealant coating unit 3, the sealing between the laminated wafers 10 by the sealant is prevented.

The sealant coating unit 3 is equipped with a coating roller 34 that serves as a contact member that contacts the outer peripheral end faces 11 of the laminated wafers 10 and applies a sealant resin. The sealant coating unit 3 is also equipped with vessel 32 that contains a sealant resin 31. A portion of the coating roller 34 is immersed in the sealant resin 31 that is contained in vessel 32 so as to impregnate the coating roller with the sealant resin or cause the sealant resin to attach to the surface of the coating roller.

Rotating inside the sealant coating unit 3 are the driving roller 100c, driven roller 100e and, by means of the pressing roller 100f, the laminated wafers 10. The coating roller 34 is pressed against a portion of the outer peripheral end faces of the laminated wafers 10. Because a resin serving as the sealant 31 is adhered to or impregnated into the surface of the coating roller 34, the sealant resin is transferred from the surface of the coating roller to the outer peripheral end faces 11, and the outer peripheral end faces 11 are coated with the resin when the coating roller 34 comes into contact with the outer peripheral end faces 11 of the laminated wafers 10.

Excessive resin on the surface of the coating roller is removed by bringing a scraper 36 into contact with the outer peripheral surface of the coating roller 34, thus ensuring that a predetermined amount of resin is present on the coating surface that contacts the outer peripheral end faces 11 of the laminated wafers 10.

A contact member with a sealant resin that comes into contact with the outer peripheral end faces 11 of the laminated wafers 10 is not limited only to a coating roller. Any porous flexible member whose outer surface, at least, can be impregnated with a sealant resin can be used. By immersing the member in a sealant resin 31 that is contained in vessel 32, the porous portions are impregnated and permeated with the sealant resin. When the porous portion comes into contact with the outer peripheral end faces 11 of the laminated wafers 10, the outer peripheral end faces are coated with sealant resin that is impregnated in the porous portion.

The operation by which the sealant resin is applied is described next with reference to FIG. 7 which shows a flowchart and to FIG. 8 which shows how the alignment is performed.

First, the laminated wafers 10 are installed in the sealant coating unit 3 (S11) and the laminated wafers 10 are aligned. The laminated wafers 10 are aligned using notches 14 or orientation flats 15 that are provided on the laminated wafers 10.

FIGS. 8(a) through (d) show how the laminated wafers 10 are aligned. Notches 14 and orientation flats 15 are formed on the laminated wafers 10. FIG. 5 shows an example where both a notch 14 and an orientation flat 15 are formed on each laminated wafer. However, it is also acceptable to use only one or the other on the laminated wafers.

The seals that are formed on the outer peripheral end faces 11 of the laminated wafers 10 enclose the peripheral portions of the wafers so that an adhesive can be injected into the inter-wafer space by a pressure difference that is created by the vacuum differential pressure method. The seal includes a segment (coating range 12) where the sealant resin is applied to form the enclosure and a segment (uncoated region 13) where the sealant resin is not applied so as to form an injection opening 16 used for injecting an adhesive therethrough. Since the laminated wafers 10 have a section where the sealant resin is applied and a section where no sealant resin is applied, the laminated wafers 10 must be properly aligned.

The alignment is performed by aligning the notch 14 or the orientation flat 15 with a corresponding part that is provided on the drive mechanism side or by using the notch 14 or the orientation flat 15 to detect the position of the laminated wafer.

FIG. 8 shows an example where the position of the notch 14 or the orientation flat 15 is used as the position of the injection opening 16 or the uncoated region 13. However, the positional relationship between the notch 14 or the orientation flat 15 and the injection opening 16 or the uncoated region 13 can be defined in any other way. FIG. 8 shows an example where the position of the notch 14 is used as the starting point 37a for coating with the sealant.

Figure 8A:
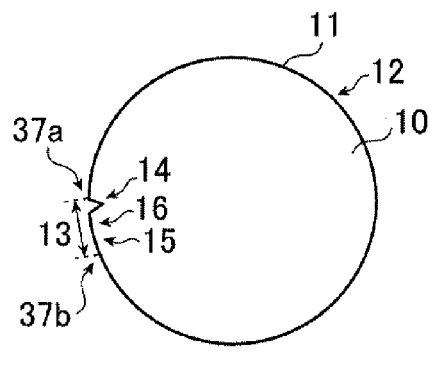
FIG. 8 shows the alignment of laminated wafers according to the invention.
Figure 8B:
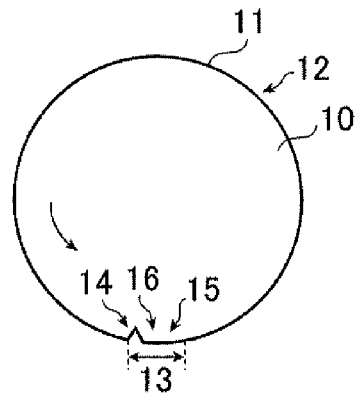

In FIG. 8(b), the laminated wafers 10 are rotated by driving roller 100c and the rotational position of the laminated wafers 10 are aligned so that the sealant coating starting point 37a is positioned, for example, above the coating roller (not illustrated).

Figure 8C:
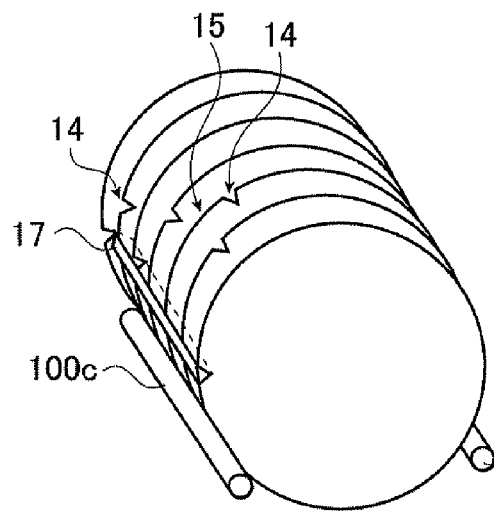
Figure 8D:
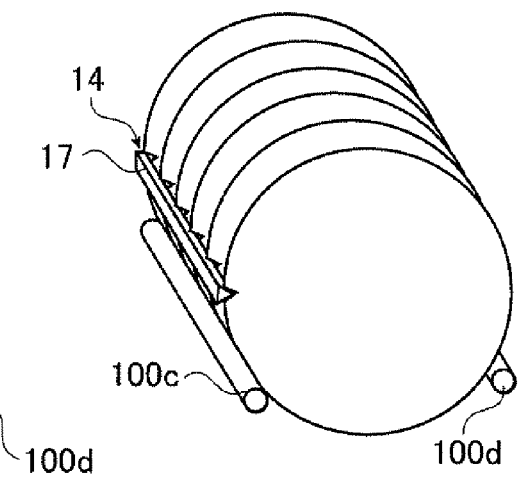

During the alignment, the notch 14 or orientation flat 15 is used to match the phase of each of the multiple laminated wafers 10. FIG. 8(c) shows the state before the phases are matched. FIG. 8(d) shows the state after the phases are matched. Here, an alignment member 17 is used to align the notches 14 so that the phase of each of the laminated wafers 10 match. The alignment member constitutes an alignment mechanism that matches the phase of each of the multiple laminated wafers 10 (S12).

After the rotational position of the laminated wafers 10 is aligned, the coating roller 34 is raised by an elevator mechanism that is not illustrated so that it comes into contact with the starting point 37a of the laminated wafers 10 (S13a).

After the coating roller 37 comes into contact with the starting point 37a of the laminated wafers 10, the laminated wafers 10 are rotated by the driving roller 100c so that the sealant resin 31 is transferred from the coating roller 34 to the outer peripheral end faces 11 of the laminated wafers 10 (S13b).

The laminated wafers 10 are rotated so that the outer peripheral end faces 11 are coated with resin 31 until a predetermined position is reached. This results in the outer peripheral end faces 11 of the laminated wafers 10 to be coated with the sealant resin 31 over the coating range 12 and for the uncoated region to be not coated with any sealant resin 31 (S13e).

After coating with the resin 31, an elevator mechanism not illustrated moves the coating roller 34 away from the outer peripheral end faces 11 of the laminated wafers 10 (S13d). The coating process is performed in steps S13a through S13d (S13).

After the outer peripheral end faces 11 of the laminated wafers 10 are coated with the sealant resin by the sealant coating unit 3, the laminated wafers 10 are moved to the sealant curing unit 4 where the resin that is applied to the laminated wafers 10 is cured. The curing of the resin is performed by irradiation with ultraviolet light if the resin is a UV setting resin and by heating if the resin is a thermosetting resin (S14). After the sealant resin is cured, the laminated wafers are removed from the seal formation apparatus (S15). An adhesive is then injected into the inter-wafer space between the laminated wafers so as to join the wafers.

Figure 9:
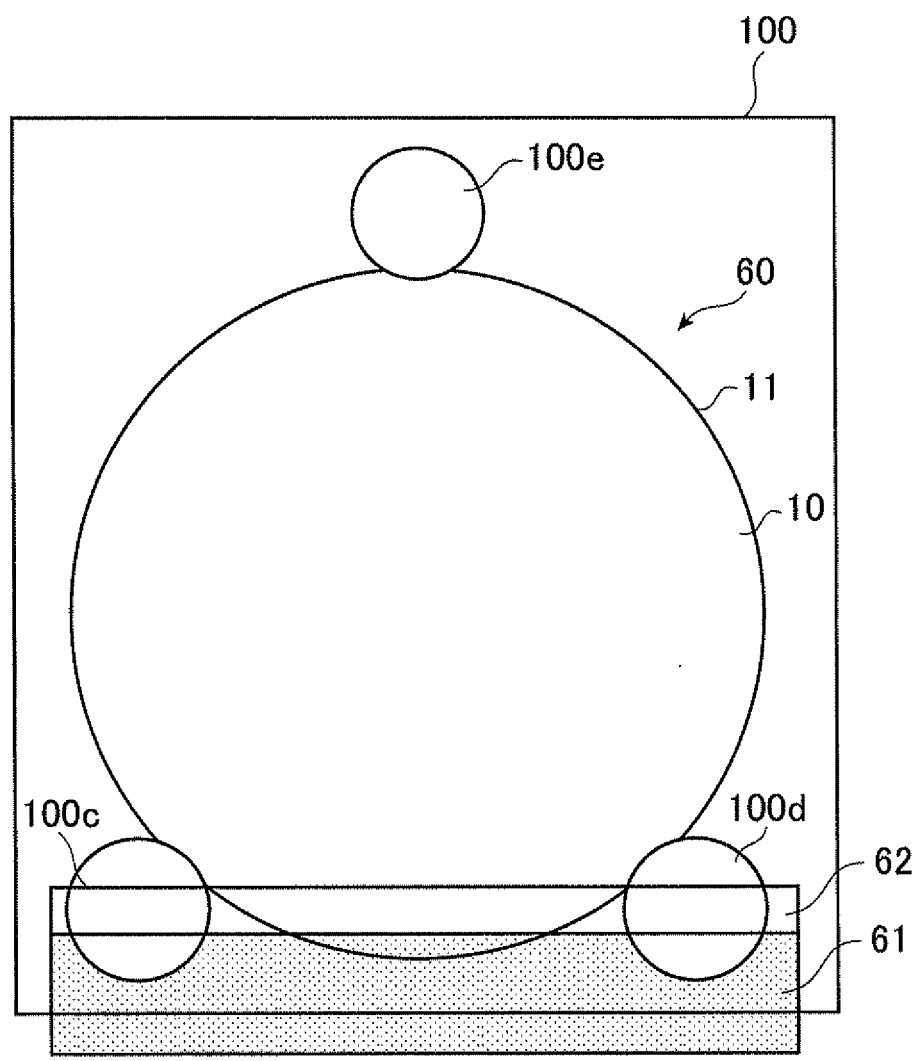
FIG. 9 is a schematic plan view showing the configuration of the adhesive injector according to the present invention.
Figure 10:
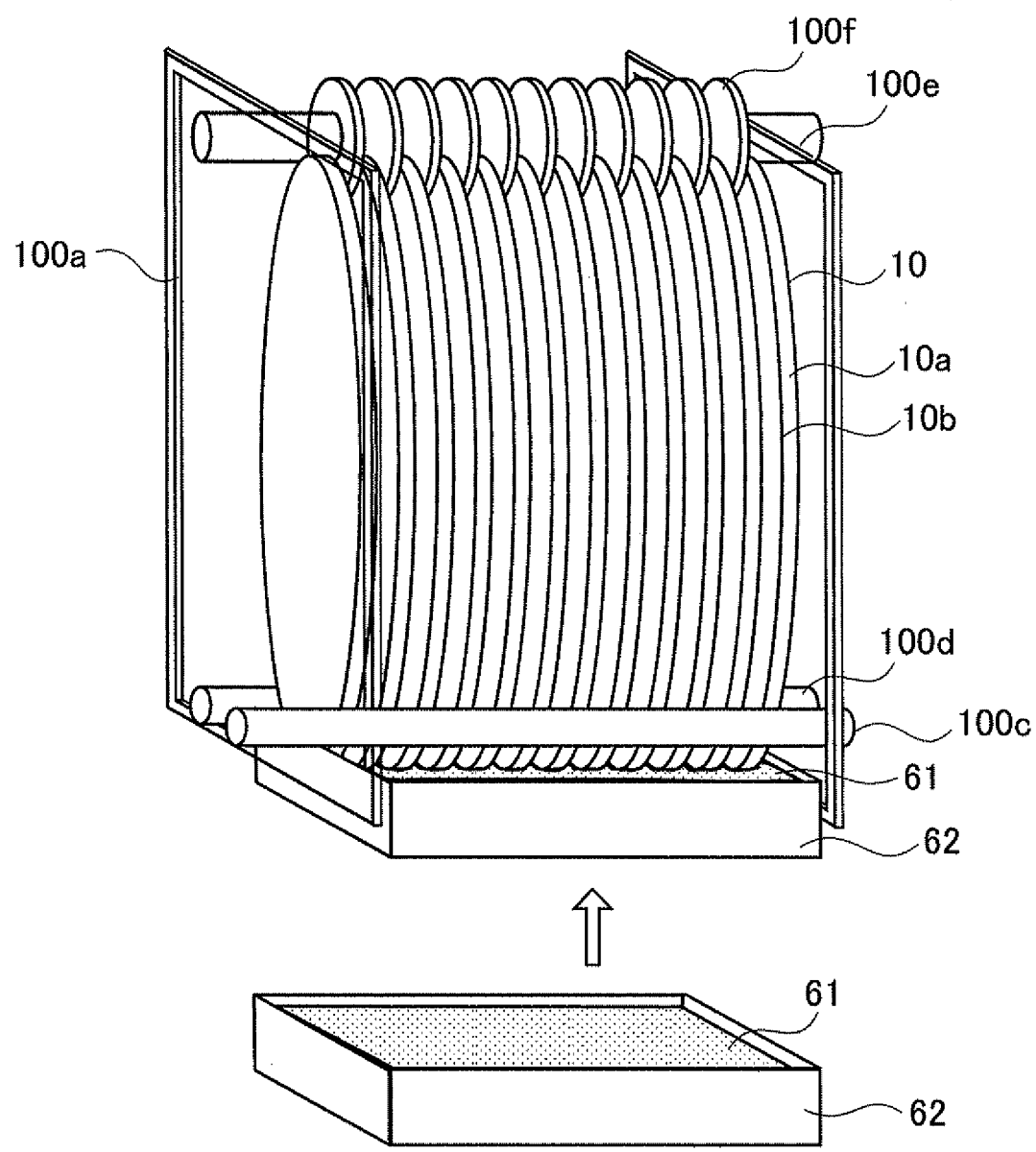
FIG. 10 schematic perspective view showing the configuration of the adhesive injector according to the present invention.

An example of the configuration of the adhesive injector 6 is described next. FIG. 9 shows a schematic plan view of an exemplary configuration. FIG. 10 shows a schematic perspective view of an exemplary configuration.

In FIG. 9 and FIG. 10, the laminated wafers 10 held in cassette 100 are introduced into the adhesive injector 6 where an adhesive is injected between the wafers of the laminated wafers 10 with the sealant resin 31 formed at their outer peripheral end faces. The laminated wafers 10 are installed in the adhesive injection chamber 60 with the injection openings 16 positioned at the bottom in the cassette 100. The phases of the plurality of laminated wafers 10 have already been matched in the sealant coating unit 3.

The adhesive injector 6 includes a vessel 62 that holds an insulating resin that serves as adhesive 61, the vessel coming into contact with the injection openings 16 of the laminated wafers 10 for injecting the adhesive. The adhesive injection chamber 60 includes a vacuum pump 64 for reducing the internal pressure to create a vacuum and a gas introduction unit 65 for introducing a gas to restore the internal pressure to an atmospheric pressure or higher by pressurization.

An elevator unit 63 moves the vessel 62 vertically. By raising the vessel 62, the adhesive 61 comes into contact with the injection openings 16 of the laminated wafers 10. By lowering the vessel 62, the adhesive 61 is moved away from the injection openings 16 of the laminated wafers 10.

Figure 11:
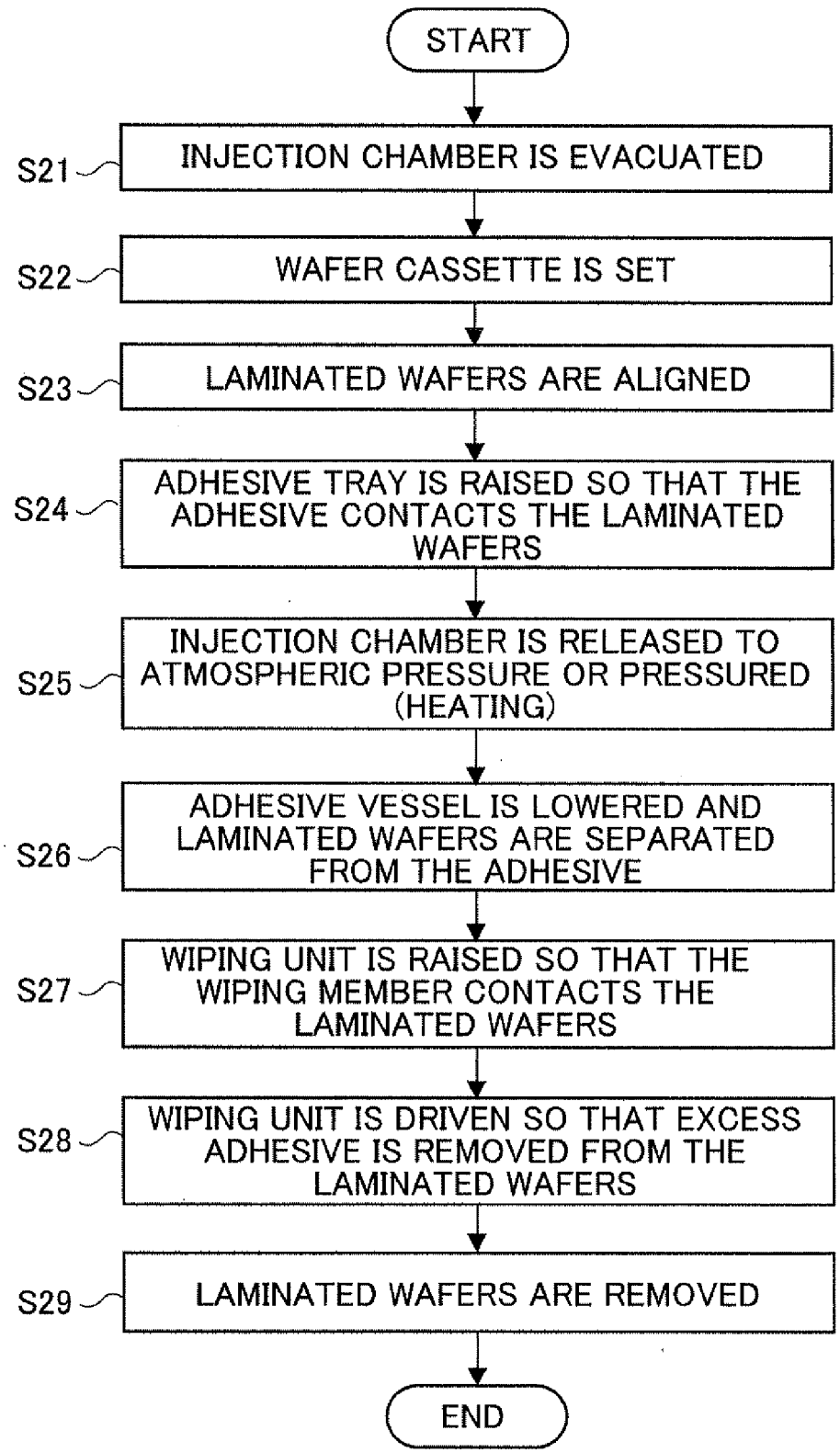
FIG. 11 is a flowchart describing the adhesive resin injection operation according to the present invention.
Figure 12:
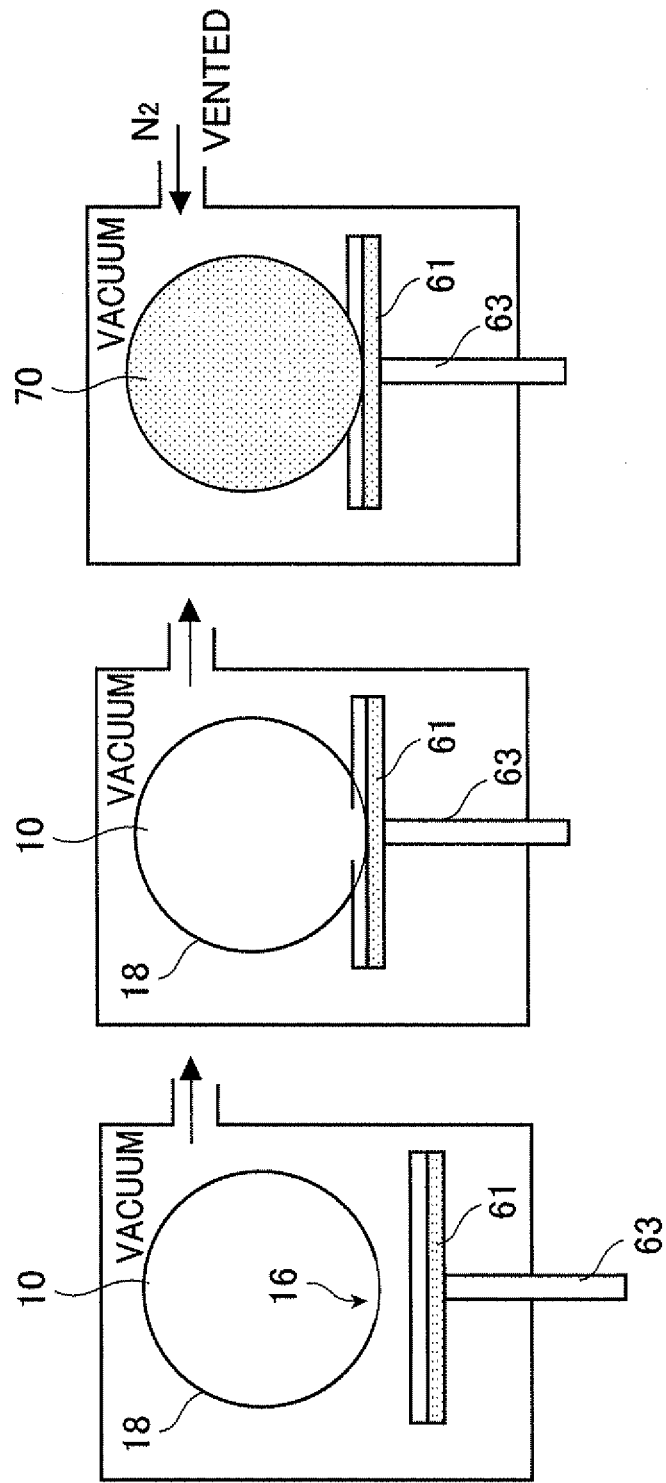
FIG. 12 shows the adhesive resin injection operation according to the present invention.

The operation involved in the injection of the adhesive resin is described next with reference to FIG. 11 showing a flowchart and to FIG. 12 showing the injection operation.

First, the vacuum evacuation pump 64 evacuates the adhesive injection chamber 60 to create a vacuum (S21). The laminated wafers 10 whose outer peripheral end faces were sealed in the seal formation step are introduced into the adhesive injection chamber 60 (S22). The cassette 100 is positioned in the adhesive injection chamber 60 to align the laminated wafers 10 (FIG. 12(a) and S23).

When the laminated wafers 10 are introduced into the adhesive injection chamber 60, the adhesive injection chamber 60 is in a vacuum state. A vacuum is also created in the inter-wafer spaces of the laminated wafers 10. The elevator unit 63 is driven and the vessel 62 is raised so that the adhesive 61 comes into contact with the injection openings 16 of the laminated wafers 10 (FIG. 12(b) and S24).

Thereafter, $N_2$ gas is introduced into the adhesive injection chamber 60 by the gas introduction unit 65, and the pressure within the adhesive injection chamber 60 is raised to atmospheric pressure or higher. The increase in the pressure within the vessel caused by the introduction of the gas creates a pressure difference between the inside and the outside of the laminated wafers 10. The pressure difference causes the adhesive resin 61 to penetrate into the inter-wafer space of the laminated wafers 10, thus injecting the adhesive. The injection of the adhesive 61 can be facilitated by heating the adhesive 61 and lowering its viscosity (FIG. 12(c) and S25).

When the injection of the adhesive 61 is completed, the elevator unit 63 is driven and the vessel 62 is lowered, thus moving the adhesive 61 away from the injection openings 16 of the laminated wafers 10 (S26).

The laminated wafers 10 with the adhesive 61 injected therein are moved to the wiping unit 8 of the wiping chamber 80 with the laminated wafers 10 still held in the cassette 100 (S27).

Figure 13:
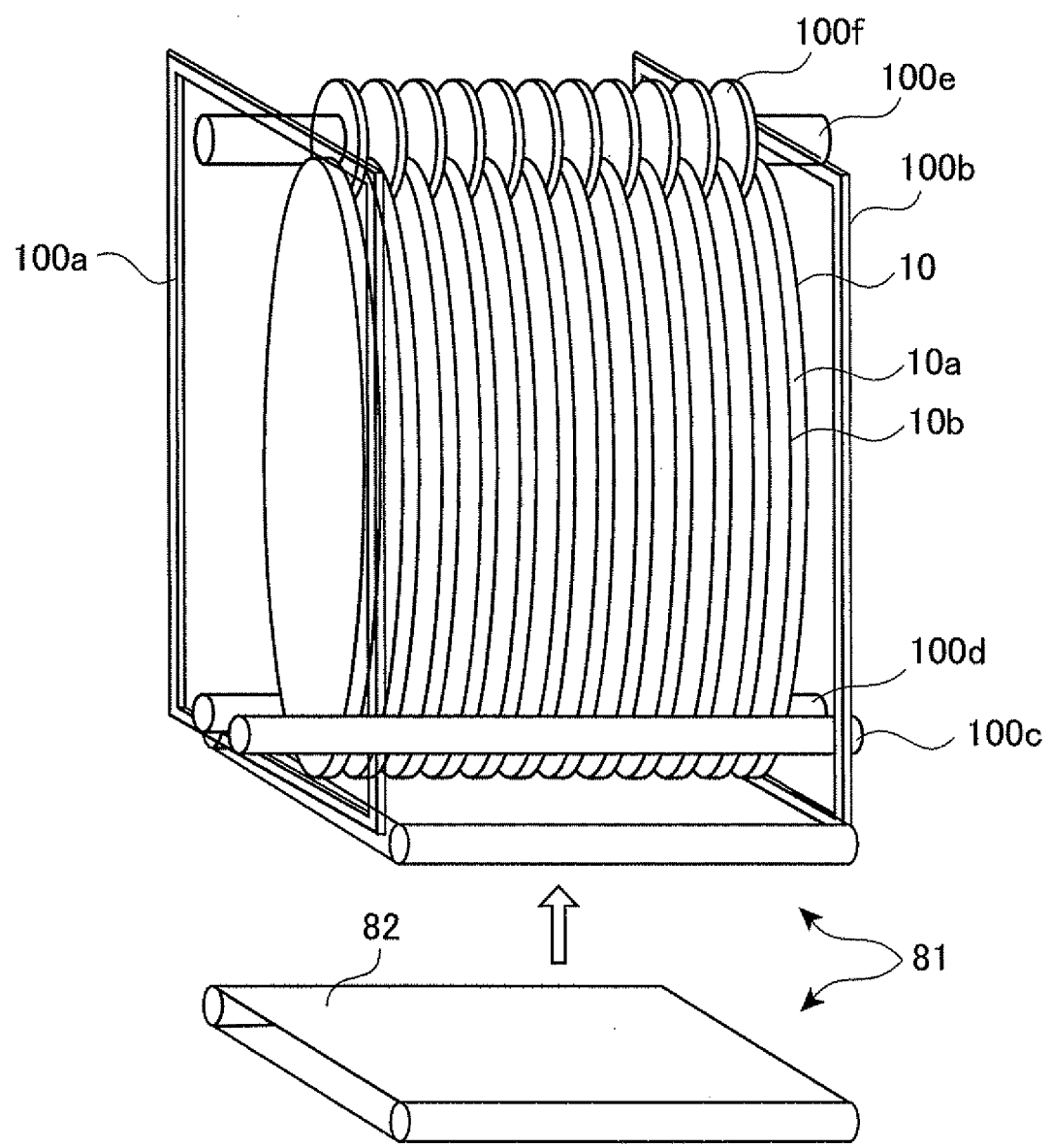
FIG. 13 shows a configuration of the wiping unit according to the present invention.

FIG. 13 shows one example of the configuration of the wiping unit 8. In FIG. 13, the wiping unit 6 includes a wiping apparatus 81 which wipes off excess adhesive that is present near the injection openings 16 of the laminated wafers 10. The wiping apparatus 81 includes, for example, a wiping material 82 that is looped around two coating rollers so as to be endlessly rotatable. The wiping material 82 is rotated and made to contact the injection openings 16 of the laminated wafers 10 so as to wipe away any excessive adhesive that is present near the injection openings 16.

An elevator unit (not illustrated) moves the wiping apparatus 81 vertically. The wiping apparatus 81 is raised to contact the injection openings 16 of the laminated wafers 10 (S27), and excessive adhesive is wiped away by the rotating wiping material (S28). After wiping away the excessive adhesive, the wiping apparatus 81 is lowered. The cassette 100 and the laminated wafers 10 in it are removed from inside the wiping chamber 80 (S29).

Figure 14:
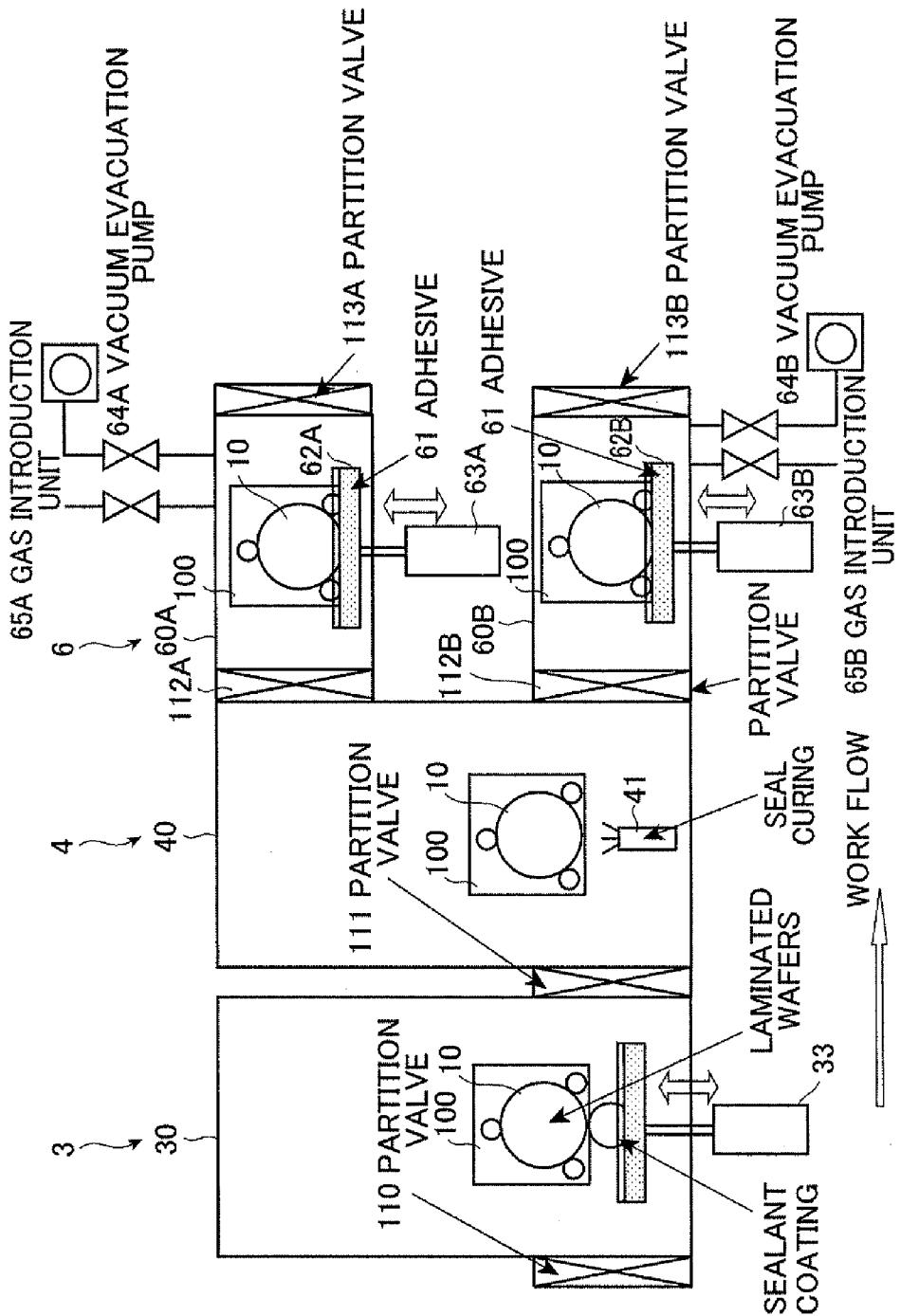
FIG. 14 shows a different configuration of the adhesive injection device according to the present invention.

A different configuration of the adhesive injection device according to the present invention is described next with reference to FIG. 14. With the configuration shown in FIG. 14, a plurality of adhesive injection chambers 60A and 60B is disposed downstream of the sealant curing unit 4 as the adhesive injector 6.

The adhesive injection chamber 60A is connected to the sealant curing unit via a partition valve 112A. The adhesive injection chamber 60B is connected to the sealant curing unit via a partition valve 112B. The adhesive injection chamber 60A includes a vessel 62A holding an adhesive 61, an elevator unit 63A for raising and lowering the vessel 62A, a vacuum pump 64A that evacuates the adhesive injection chamber 60A for creating a vacuum and a gas introduction unit 65A for introducing a gas into the adhesive injection chamber 60A. The adhesive injection chamber 60B includes a vessel 62B holding an adhesive 61, an elevator unit 63B for raising and lowering the vessel 62B, a vacuum pump 648 for evacuating the adhesive injection chamber 60B and creating a vacuum and a gas introduction unit 65B for introducing a gas into the adhesive injection chamber 60B.

The laminated wafers 10 contained in cassette 100 are introduced from the sealant curing chamber 40A to the adhesive injection chambers 60A and 60 B through the partition valves 112A and 112B.

If the injection rate at the adhesive injector 6 is slower than the curing rate at the sealant curing unit 4, the processing rate of the laminated wafers will be determined by the processing rate of the adhesive injector 6 with the slower processing rate. With the configuration shown in FIG. 14, the number of adhesive injection chamber 60 used by the adhesive injector 6 has been increased to increase the processing rate of the adhesive injection device as a whole.

Figure 15:
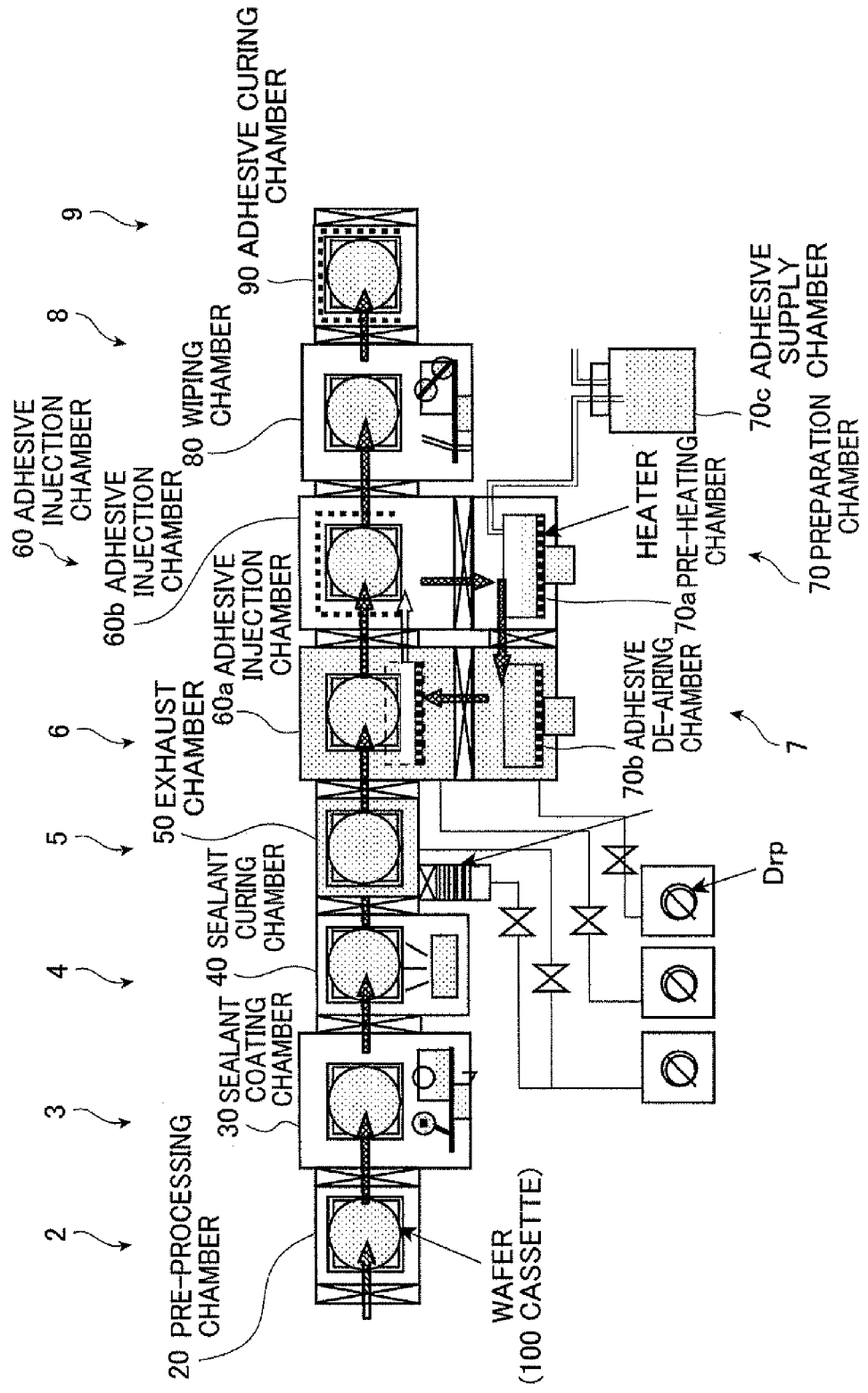
FIG. 15 is a schematic view showing the overall configuration of the adhesive injection device 1 according to the present invention.

FIG. 15 shows a schematic view of the overall configuration of the adhesive injection device 1 according to the present invention. The afore-described sealant coating unit 3, sealant curing unit 4, adhesive injector 6, wiping unit 8 and adhesive curing unit 9 are component units that make up the overall adhesive injection device 1. The configuration shown in FIG. 15 is one example for efficiently injecting an adhesive.

The adhesive injection device 1 shown in FIG. 15 includes the pre-processing unit 2, sealant coating unit 3, sealant curing unit 4, exhaust unit 5, adhesive injector 6, adhesive preparation unit 7, wiping unit 8 and adhesive curing unit 9. The pre-processing chamber 20, sealant coating chamber 30, sealant curing chamber 40, exhaust chamber 50, adhesive injection chamber 60 and adhesive preparation chamber 70, wiping chamber 80 and adhesive curing chamber 90 which constitute the respective units are arranged in-line, reflecting the laminated wafer processing flow. The adhesive preparation chamber 70 is disposed in parallel with the adhesive injection chamber 60. The adhesive that is prepared in the adhesive preparation chamber 70 is moved to the adhesive injection chamber 60 where the adhesive undergoes the injection process. When the injection of the adhesive to the laminated wafers 10 in one cassette 100 is completed, the adhesive is returned to the adhesive preparation chamber 70 and undergoes preparation for the injection into the laminated wafers 10 that are held in the next cassette 100.

The adhesive preparation chamber 70 includes a pre-heating chamber 70a where the adhesive is heated to reduce its viscosity and an adhesive de-airing chamber 70b where air bubbles present in the adhesive at a lower pressure are released. The adhesive injection chamber 60 includes a first adhesive injection chamber 60a and a second adhesive injection chamber 60b. The first adhesive injection chamber 60a and the second adhesive injection chamber 60b which are connected in-line are disposed between the exhaust chamber 50 and the wiping chamber 80. The first adhesive injection chamber 60a receives the adhesive that has undergone the de-airing process in the adhesive de-airing chamber 70b and performs the adhesive injection process. The second adhesive injection chamber 60b returns to the pre-heating chamber 70a the adhesive that remains after the injection process is performed in the first adhesive injection chamber 60a. The pre-heating chamber 70a once again preheats the adhesive that is returned from the second adhesive injection chamber 60b and sends the adhesive to the adhesive de-airing chamber 70b where the de-airing process is performed.

As afore-described, the adhesive circulates through the pre-heating chamber 70a, adhesive de-airing chamber 70b, first adhesive injection chamber 60a and second adhesive injection chamber 60b.

In the afore-described configuration, the laminated wafers 10 are installed in cassette 100 in the pre-processing chamber 20 of the pre-processing unit 2. Once that is done, the laminated wafers 10 are processed while they are installed in the cassette 100. A turbo molecular pump (TMP) and an oil rotary vacuum pump (DRP) are connected to the exhaust chamber 50 of the exhaust unit 5, and the pressure is reduced in preparation for the pressure to be encountered in the first adhesive injection chamber 60a. An oil rotary vacuum pump (DRP) is connected to the first adhesive injection chamber 60a and the adhesive de-airing chamber 70b.

An adhesive is supplied to the pre-heating chamber 70a from the adhesive supply chamber 70c and replenishes the adhesive that is lost by the injection of the adhesive.

Figure 16:
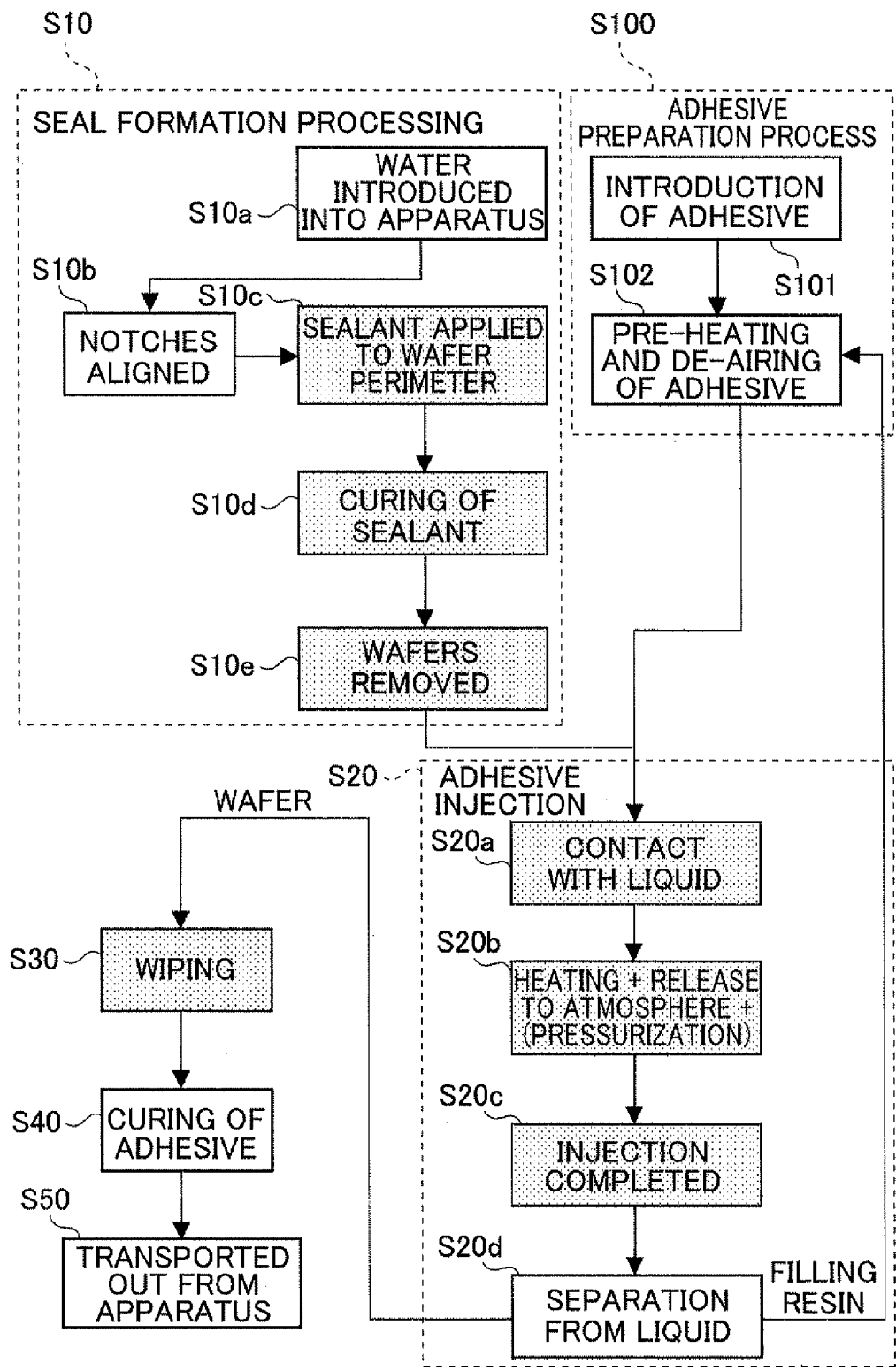
FIG. 16 is a flowchart describing an example of the operation of the adhesive injection device according to the present invention.
Figure 17D:
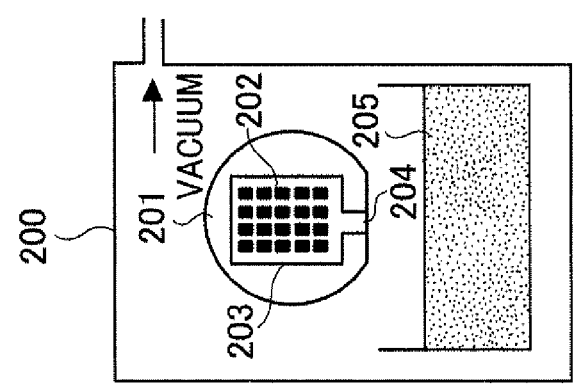
FIG. 17 describes the conventional process for injecting an insulating adhesive into the inter-wafer spaces using a sealant.
Figure 17C:
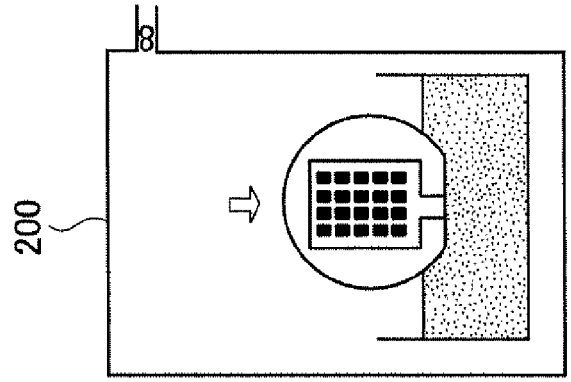
Figure 17B:
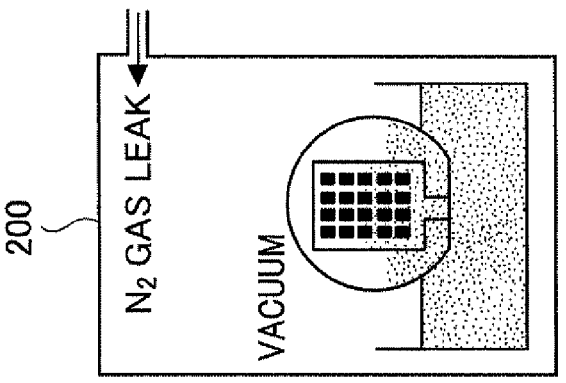
Figure 17A:
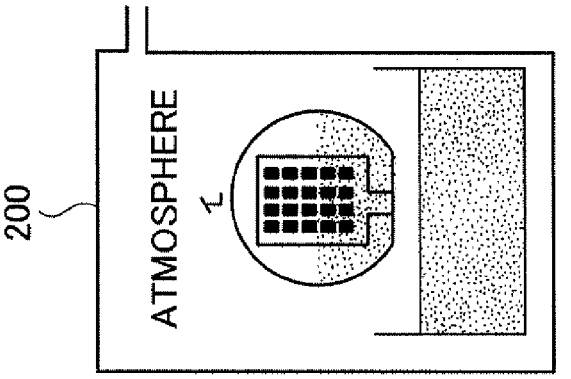
Figure 18:
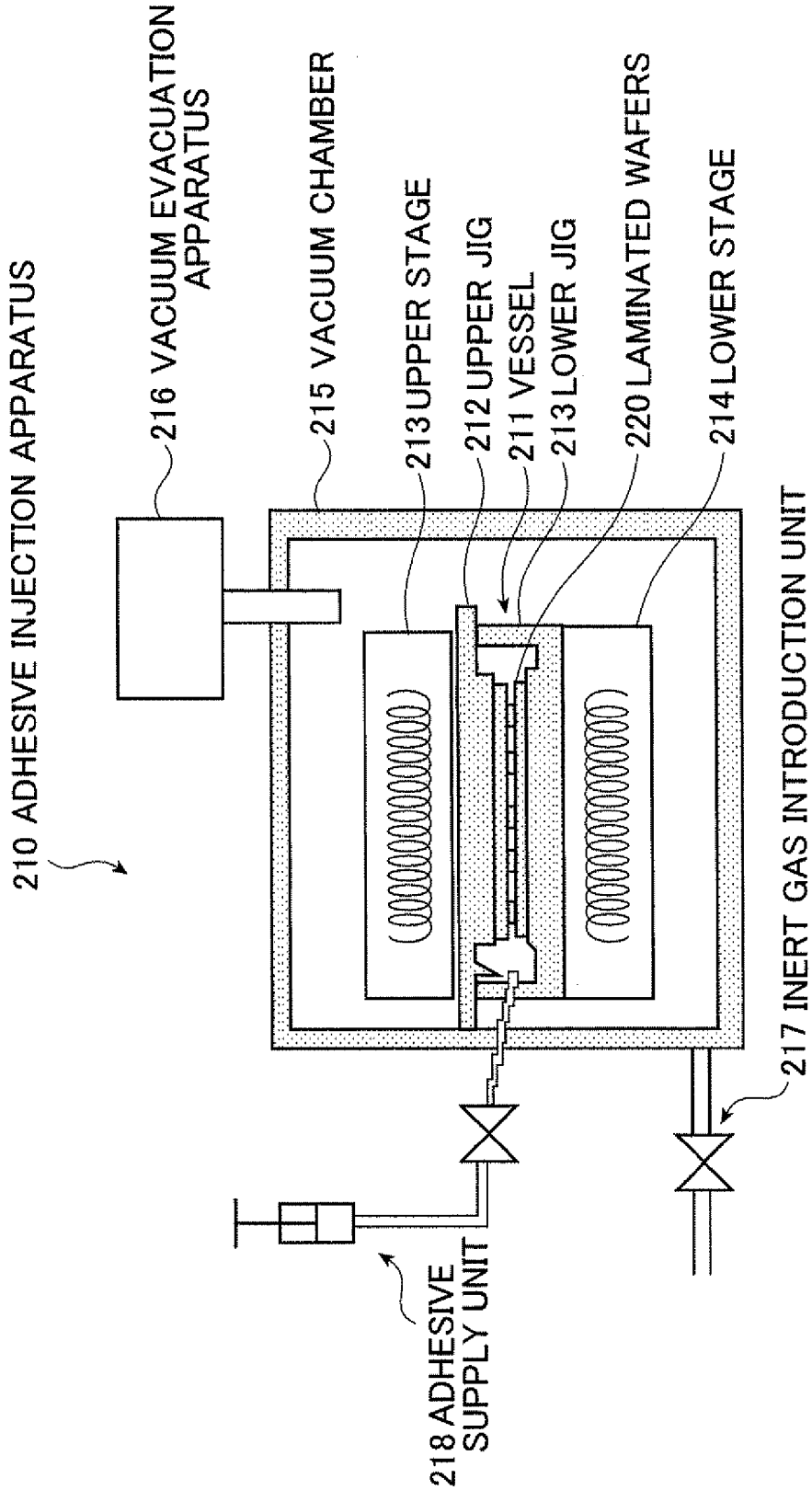
FIG. 18 describes the conventional process for injecting a resin using the vacuum differential pressure method with an adhesive disposed along the entire perimeter of a wafer.

FIG. 16 is a flowchart showing an example of the operation of the adhesive injection device 1.

In the flowchart shown in FIG. 16, the operation of the adhesive injection device 1 includes the seal formation process (S10), the adhesive injection process (S20), the adhesive wiping process (S30), the adhesive curing process (S40), the process for the removal from the apparatus (S50) and the adhesive preparation process (S100).

Figure 7:
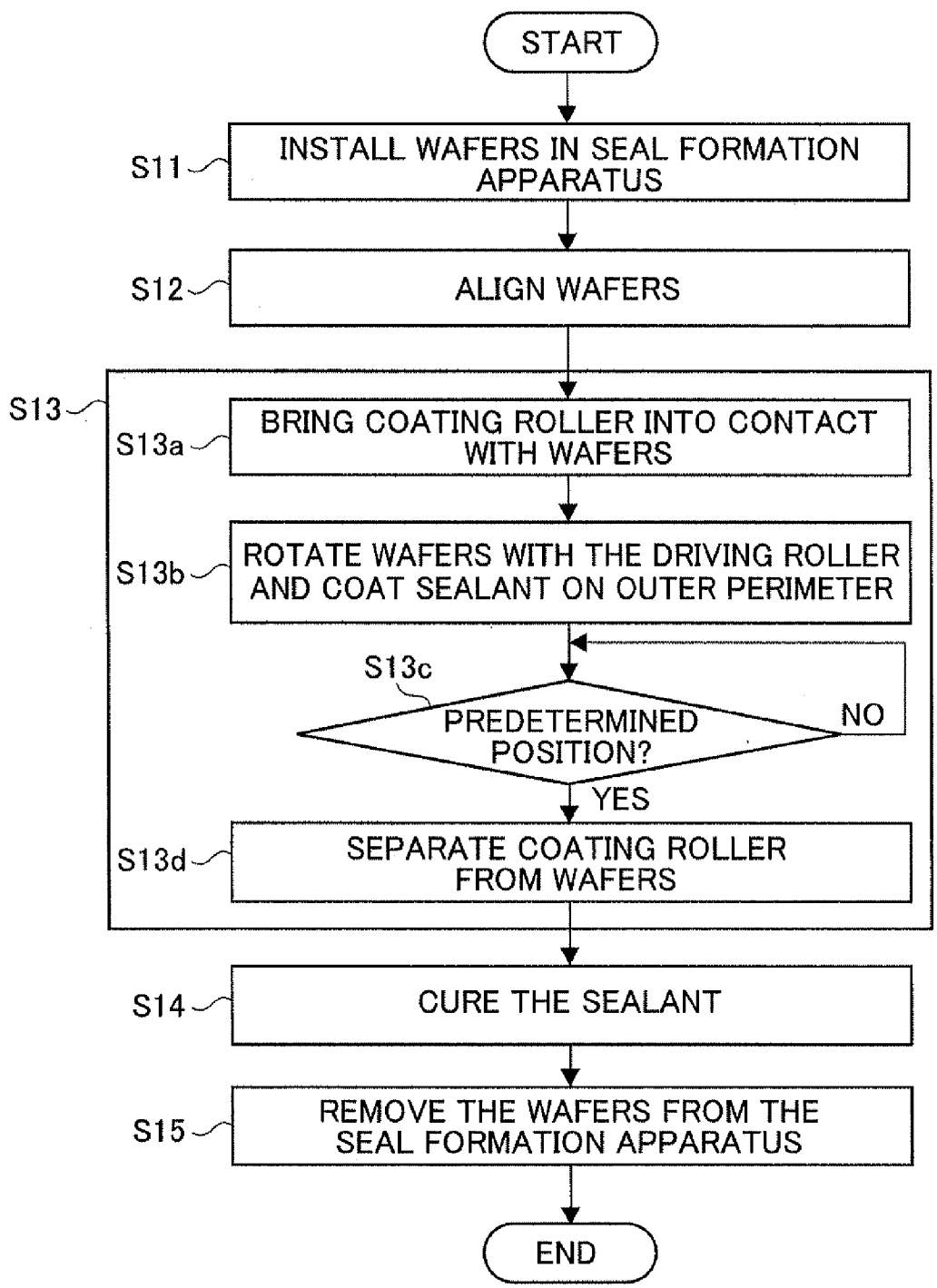
FIG. 7 a flowchart describing the sealant resin coating operation according to the present invention.

With the seal formation process (S10), as shown by the flowchart in FIG. 7, the laminated wafers 10 placed in the cassette 100 are installed in the adhesive injection device 1 (S10a); the phases of the respective laminated wafers are matched using either the notches or orientation flats (S10b); the sealant is applied to the outer peripheral end faces of the laminated wafers 10 (S10c); the applied sealant is cured (S10d); and the laminated wafers 10—while held in the cassette 100—are removed from the seal processing apparatus (S10e).

With the adhesive preparation process (S100), processes such as pre-heating and de-airing (S102) are performed on the adhesive that is introduced (S101).

The laminated wafers that were sealed by the seal formation process (S10) and the adhesive 61 that was prepared in the preparation process (S100) are used in the adhesive injection process (S20). The injection openings of the laminated wafers 10 are brought into contact with the adhesive 61 (S20a). By the combination of the reduced viscosity of the adhesive 61 through heating, the lowered pressure and either the release of pressure to atmospheric pressure or pressurization to above the atmospheric pressure, the adhesive 61 is injected into the inter-wafer space of the laminated wafers 10 (S20b). After the injection is completed (S20c), the adhesive 61 is moved away from the cassette 100 containing the laminated wafers 10 (S20d).

The adhesive injection process (S20) is followed by the process for wiping away the adhesive (S30), the adhesive curing process (S40) and the removal from the apparatus (S50).

Because, with the present invention, the series of processes is performed in-line, there is no exposure to outside atmosphere. This prevents the contamination of the adhesive that is injected.

With previous adhesive injection processes, some processes had to be performed in vessels of different apparatuses. These processes include the process where semiconductor chips that are formed by dicing a semiconductor wafer are laminated within an enclosure and a resin is injected to form an insulating resin layer, the process where the outer peripheral end faces of wafers are sealed and an insulating adhesive is injected through injection openings into the inter-wafer space, the process for dicing a semiconductor wafer into semiconductor chips and the process for sealing the outer peripheral end faces of the wafers. This meant that the semiconductor chips or the wafers that were sealed had to be taken out into external atmosphere when the wafers are introduced into a vessel for injection with an adhesive. This means an exposure to an external atmosphere which presents the risk of adhesion of particles onto the wafer surfaces and the effects of other contamination.

In contrast to this, with the present invention, since laminates consisting of a plurality of substrates such as semiconductor wafers are processed while they are integrally stored in a cassette, there is no exposure to external atmosphere, thus preventing the effects of contamination caused by, for example, the adhesion of particles on the wafer surfaces.

With the previous adhesive injection process, using the pressure difference between the vessel and the laminated wafers to inject an adhesive from the entire perimeter of the laminated wafers required the process to be performed with the laminated wafers placed within a single vessel. This meant that, as the laminated wafers became larger and the adhesive injection time lengthened, the increase in the injection time translated directly into an increase in the manufacturing time of the semiconductor device, creating a problem of becoming a factor that reduced production quantity.

In contrast to this, with the present invention, because the adhesive is injected from only a segment of the outer peripheral edges of the laminated wafers, even when the laminated wafers were to increase in size and the adhesive injection time to increase, the increase in the injection time can be suppressed, thus preventing an increase in the semiconductor device manufacturing time and preventing a drop in production quantity.

With the previous adhesive injection process, when the vacuum differential pressure method is used to inject an adhesive resin into the inter-wafer space of laminated wafers, the pressure within the vessel was reduced to create a vacuum. This meant the need to evacuate the vessel or to de-air the adhesive resin to release the air bubbles that are present in the adhesive. Since the amount of time required for these processes was not the same, if the adhesive injection process was performed in-line in a continuous process, the time required for the adhesive injection process greatly affected the overall processing time, becoming a factor that prevented improving the productivity of semiconductor device production.

In contrast to this, the present invention allows shortening the time required for the adhesive injection process, eliminating the restriction imposed on productivity by the adhesive injection process in a continuous process for the manufacturing of semiconductor devices.

With the previous adhesive injection process where a pressure difference was used to inject an adhesive from injection openings in laminated wafers, excess adhesive may be present near the injection openings after the injection process is completed, presenting the problem of the adhesive that is present near the injection openings becoming a factor for the contamination of the wafers.

In contrast to this, with the present invention, an adhesive wiping unit is provided so that the adhesive that is present near the injection openings is removed, thus eliminating a wafer contamination factor.

One conceivable way for reducing the time required for the injection of an adhesive into laminated wafers is to inject the adhesive into multiple laminated wafers at the same time. Injecting an adhesive into multiple laminated wafers requires aligning the positions of the injection openings of the multiple laminated wafers in the processing chamber where the adhesive is injected. Also, in performing each of the steps involved in the adhesive injection process, multiple laminated wafers must be processed using the same processing conditions. This requires an alignment mechanism for aligning the multiple laminated wafers that are in the processing chamber.

However, ordinarily, reducing the time required for the vacuum evacuation of the processing chamber requires the size of the processing chamber to be small. Disposing a mechanism for aligning the injection openings of multiple laminated wafers within a small space is difficult.

In contrast to this, the alignment mechanism of the present invention allows the injection openings of multiple laminated wafers to be easily aligned even within a small space.

The present invention is not limited to any of the afore-described embodiments, and the present invention can be modified in various ways without deviating from the gist of the present invention and the scope of the present invention.

FIELD OF INDUSTRIAL USE

The seal formation method and seal formation apparatus according to the present invention can be used with 3-dimensional semiconductor devices and 3-dimensional semiconductor circuit devices.

DESCRIPTION OF THE NUMERICAL REFERENCES

1. Adhesive injection device
2. Pre-processing unit
3. Sealant coating unit sealant coating unit
4. Sealant curing unit
5. Exhaust unit
6. Adhesive injector
7. Adhesive preparation unit
8. Wiping unit
9. Adhesive curing unit
10. Laminated wafer
10a-10n. Laminated wafer
10A, 10B. Wafer
10C. Pitch
11. Wafer edge face
12. Coating range
13. uncoated region
14. Notch
15. Orientation flat
16. Scraper
17. Alignment member
18. Seal
20. Pre-processing chamber
30. Sealant coating chamber
31. Sealant
32. Vessel
33. Elevator unit
34. Coating roller
35. Retaining spring
36. Scraper
37. Sealant coating unit
37a. Coating starting position
37b. Coating ending position
38. Holding roller
40. Sealant curing chamber
41. Sealant curing apparatus
50. Exhaust chamber
60. Adhesive injection chamber
60a, 60b. Adhesive injection chamber
61. Adhesive
62. Vessel
63. Elevator unit
64. Vacuum evacuation pump
65. Gas introduction unit
70. Adhesive preparation chamber
70a. Pre-heating chamber
70b. Adhesive de-airing chamber
70c. Adhesive supply chamber
80. Wiping chamber
81. Wiping apparatus
82. Wiping material
90. Adhesive curing chamber
91. Adhesive curing apparatus
100. Cassette
100a, 100b. Frame member
100c. Driving roller
100d. Driven roller
100e. Pressing roller
100f Spacer member
110-113. Partition valve

What is claimed is:

1. An adhesive injection device for injecting an adhesive between laminate substrates, comprising:
   a cassette for holding a plurality of laminates arranged in the direction of lamination of each said substrate, each laminate having at least two substrates that face each other;
   an adhesive injector for injecting an adhesive into each inter-substrate space, as said laminates being held in said cassette, so that the actions of injecting said adhesive into each said inter-substrate space overlap in time; and
   a coating unit for coating the outer peripheral end faces of said plurality of laminates with a sealant wherein said coating unit comprises a contact member which applies said sealant and the state where at least a part of each of said outer peripheral end faces is contacted by said contact member overlaps in time.

2. The adhesive injection device according to claim 1, wherein said plurality of laminates are held by said cassette to be rotatable about an axial line extending in their arrangement direction such that, by the rotation about said axial line, said outer peripheral end faces are coated with said sealant by said coating unit.

3. The adhesive injection device according to claim 2 wherein said plurality of laminates have an uncoated region where said sealant is not applied and said adhesive injection device further comprises an alignment mechanism for aligning said uncoated region of each of said laminates at a predetermined rotational position of each of said laminates.

4. The adhesive injection device according to claim 3 wherein said alignment mechanism positions each of said laminates using, as a reference, notches or orientation flats that are formed on said substrates.

5. The adhesive injection device according to claim 3 wherein said alignment mechanism positions said uncoated region of each of said laminates at the same rotational position.

6. The adhesive injection device according to any claim 3 wherein said adhesive injector comprises a vessel which contains said adhesive and receives said plurality of laminates so that the state where at least said uncoated regions of said plurality of laminates are in contact with said adhesive overlaps in time.

7. The adhesive injection device according to claim 6 wherein said adhesive injector uses a vacuum differential pressure method to inject said adhesive into inter-substrate spaces between said substrates through said uncoated regions.

8. The adhesive injection device according to claim 2 wherein said cassette comprises two frame members that hold said plurality of laminates in between from both sides in the arrangement direction of the plurality of laminates and connecting members which connect said frame members and also support said plurality of laminates.

9. The adhesive injection device according to claim 8 wherein said connecting members comprise a rotating roller that rotates about an axial line extending along the arrangement direction of said plurality of laminates, the rotation of said rotating roller causing the rotation of said laminates.

10. The adhesive injection device according to claim 9 wherein said connecting members further comprise: a driven roller that supports said plurality of laminates and is driven to rotate by said rotating roller; and a pressing roller that presses each said laminate against said rotating roller and said driven roller.

11. The adhesive injection device according to claim 10 wherein said pressing roller can move towards or move away from said plurality of laminates.

12. The adhesive injection device according to claim 10 wherein at least one of said rotating roller, said driven roller and said pressing roller is provided with a plurality of spacer members which are disposed between said plurality of laminates to form an inter-laminate space of a predetermined size between said plurality of laminates.

13. The adhesive injection device according to claim 12 wherein the thickness dimension of each of said spacer members is large enough so that when the outer peripheral end faces of said plurality of laminates are coated with said sealant by said coating unit, the sealing between said laminates by said sealant is prevented.

14. An adhesive injection device for injecting an adhesive, comprising:
a cassette which holds a plurality of laminates that are arranged in the direction of lamination of each said substrate, each laminate having at least two substrates that face each other;
an adhesive injector for injecting an adhesive into each inter-substrate space, as said laminates are being held in said cassette, so that the actions of injecting said adhesive into each said inter-substrate space overlap in time;
a coating unit for coating the outer peripheral end faces of said plurality of laminates with a sealant wherein said coating unit comprises a contact member which applies said sealant and the state where at least a part of each of said outer peripheral end faces is contacted by said contact member overlaps in time, and said plurality of laminates have an uncoated region where said sealant is not applied; and
an adhesive wiping unit for wiping off any excess adhesive that is present at said uncoated regions of said plurality of laminates.

15. An adhesive injection device for injecting an adhesive, comprising:
a cassette which holds a plurality of laminates that are arranged in the direction of lamination of each said substrate, each laminate having at least two substrates that face each other;
an adhesive injector for injecting an adhesive into each inter-substrate space, as said laminates are being held in said cassette, so that the actions of injecting said adhesive into each said inter-substrate space overlap in time;
a coating unit for coating the outer peripheral end faces of said plurality of laminates with a sealant wherein said coating unit comprises a contact member which applies said sealant and the state where at least a part of each of said outer peripheral end faces is contacted by said contact member overlaps in time; and
a sealant curing unit for curing said sealant coated by said coating unit.

16. The adhesive injection device according to claim 15 further comprising an adhesive preparation chamber for preparing said adhesive used by said adhesive injector wherein said coating unit, said sealant curing unit, said adhesive injector and said adhesive preparation chamber are disposed in-line.

* * * * *